United States Patent
Kaneyama et al.

(10) Patent No.: US 12,356,620 B2
(45) Date of Patent: Jul. 8, 2025

(54) SEMICONDUCTOR DEVICE AND METHOD FOR MANUFACTURING SAME

(71) Applicant: Kioxia Corporation, Tokyo (JP)

(72) Inventors: Junichi Kaneyama, Yokkaichi Mie (JP); Keiichi Sawa, Yokkaichi Mie (JP); Hiroyuki Yamashita, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 506 days.

(21) Appl. No.: 17/887,766

(22) Filed: Aug. 15, 2022

(65) Prior Publication Data

US 2023/0164998 A1 May 25, 2023

(30) Foreign Application Priority Data

Nov. 25, 2021 (JP) ................ 2021-191334

(51) Int. Cl.
*H10B 43/27* (2023.01)
*H10D 64/01* (2025.01)
*H10D 64/68* (2025.01)

(52) U.S. Cl.
CPC ........... *H10B 43/27* (2023.02); *H10D 64/037* (2025.01); *H10D 64/685* (2025.01)

(58) Field of Classification Search
CPC ..... H10B 43/27; H10D 64/037; H10D 64/685
See application file for complete search history.

(56) References Cited

U.S. PATENT DOCUMENTS

| | | | |
|---|---|---|---|
| 8,253,189 B2 | 8/2012 | Sekine et al. | |
| 8,278,696 B2 | 10/2012 | Ozawa et al. | |
| 11,737,281 B2 * | 8/2023 | Seki ................ | H10B 43/20 |
| | | | 257/295 |
| 2021/0083064 A1 | 3/2021 | Okada et al. | |
| 2021/0249420 A1 | 8/2021 | Seki et al. | |

FOREIGN PATENT DOCUMENTS

| | | |
|---|---|---|
| JP | 5238332 B2 | 7/2013 |
| JP | 5443873 B2 | 3/2014 |
| JP | 2021-048172 A | 3/2021 |
| JP | 2021-125594 A | 8/2021 |

* cited by examiner

*Primary Examiner* — Allison Bernstein
(74) *Attorney, Agent, or Firm* — Foley & Lardner LLP

(57) ABSTRACT

A semiconductor device includes a plurality of electrode layers separated from each other in a first direction, a charge storage layer provided on side surfaces of the plurality of electrode layers via a first insulating film, and a semiconductor layer provided on a side surface of the charge storage layer via a second insulating film. The charge storage layer includes a location having a fluorine concentration of $5.0 \times 10^{18}$ atoms/cm$^3$ or less. A fluorine concentration at an interface between the charge storage layer and the second insulating film is 10 times or more or 1/10 or less of a fluorine concentration at an interface between the charge storage layer and the first insulating film.

20 Claims, 17 Drawing Sheets

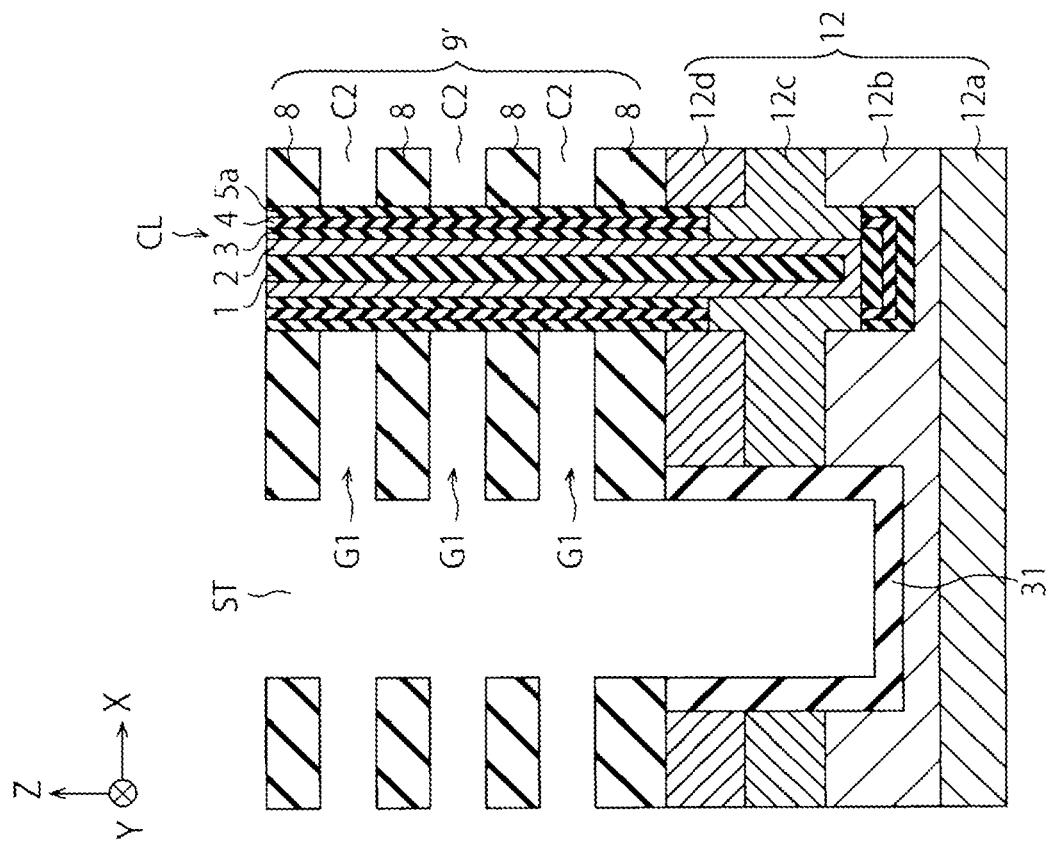

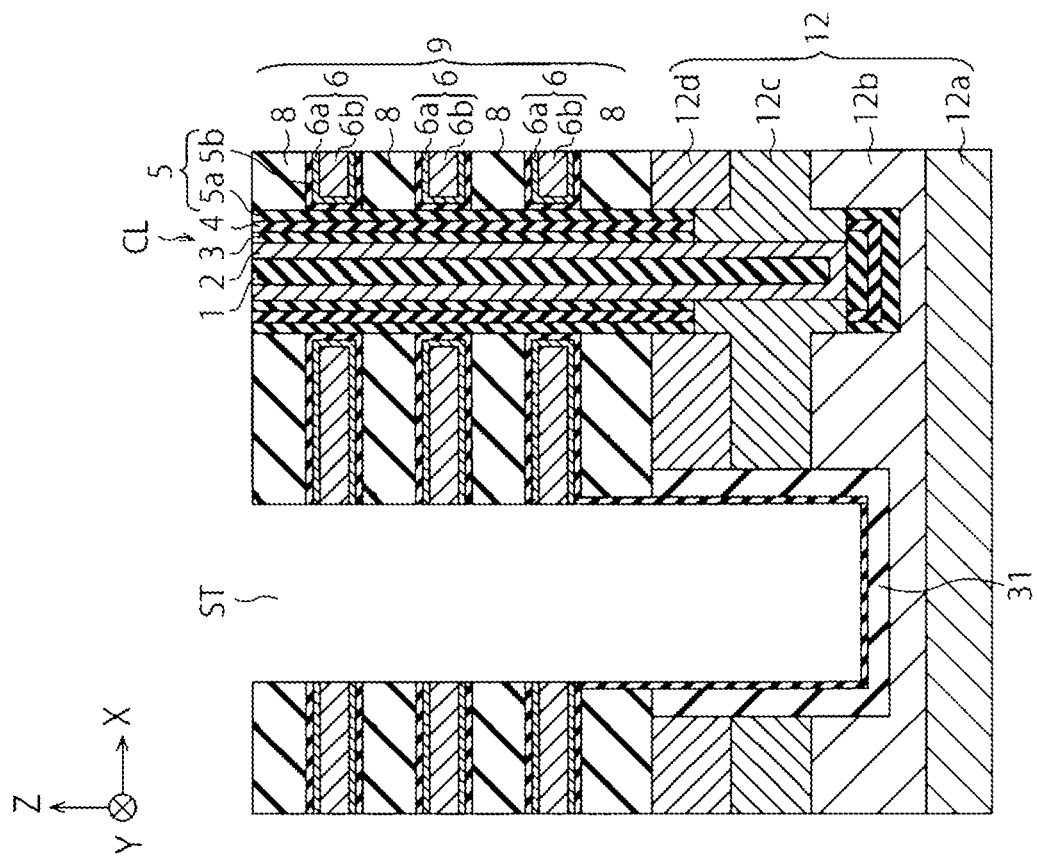
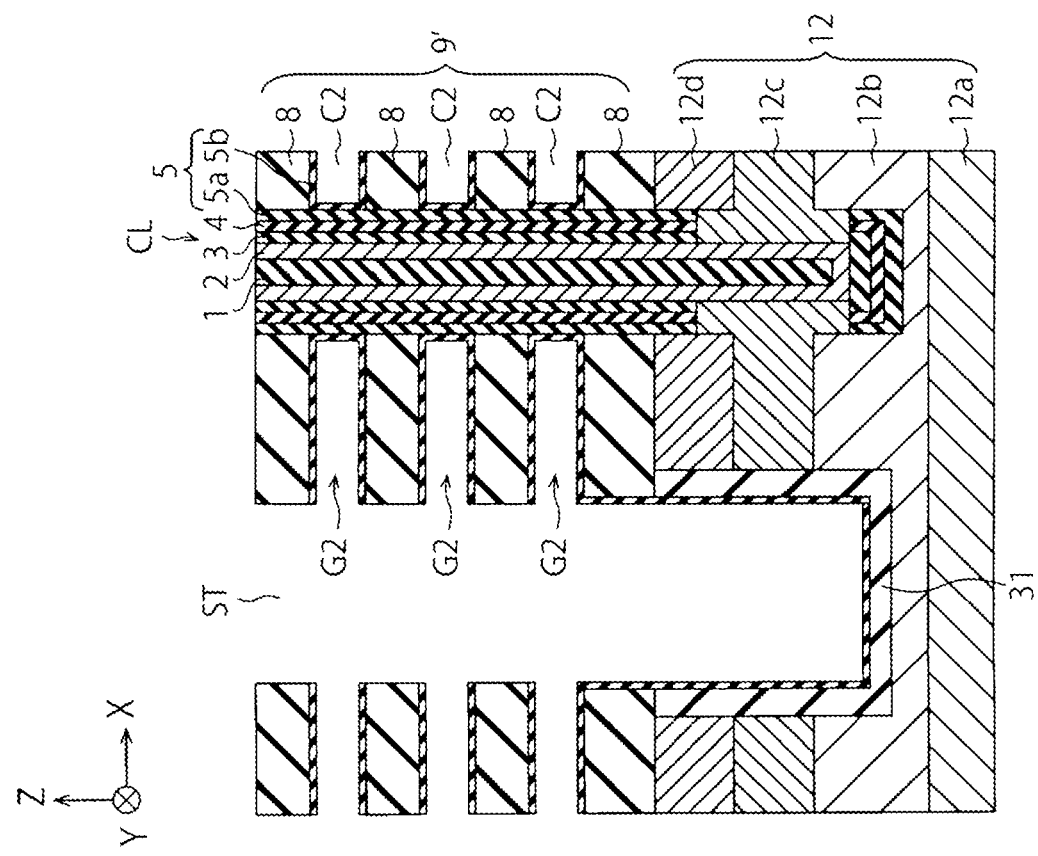

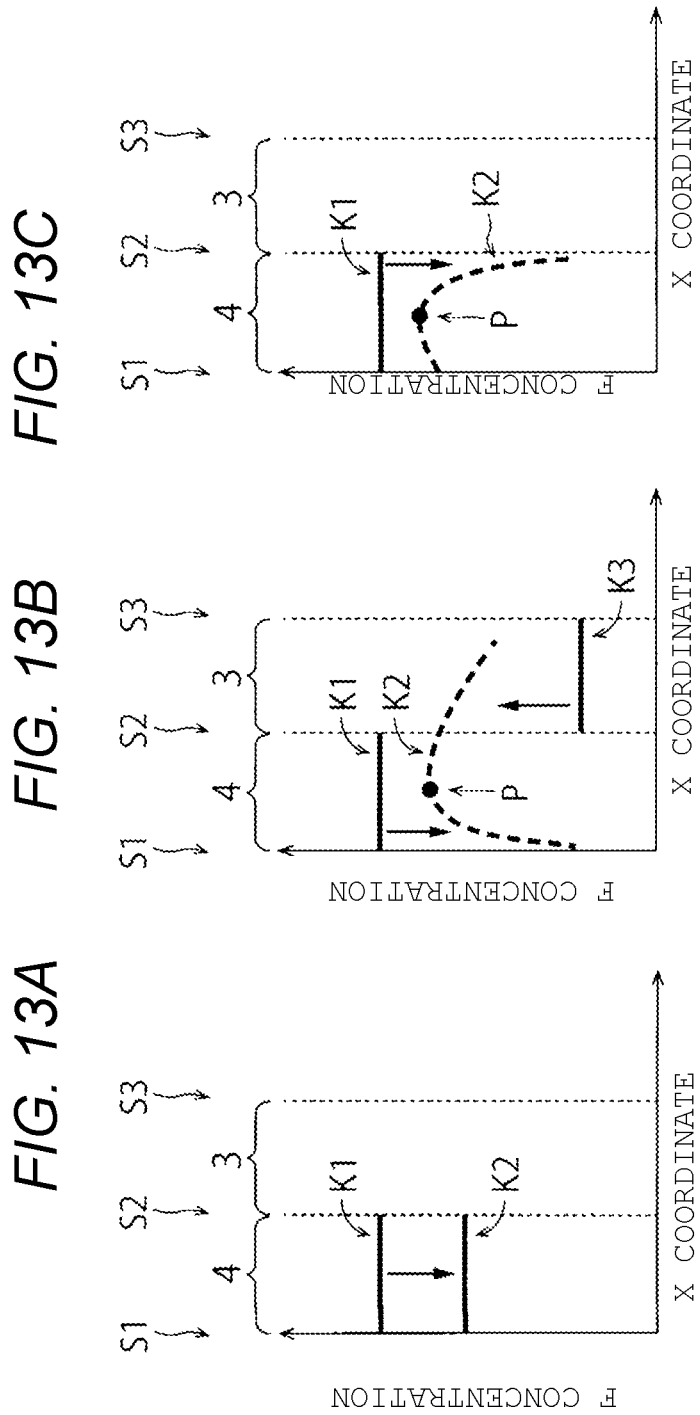

SEMICONDUCTOR DEVICE AND METHOD FOR MANUFACTURING SAME

CROSS-REFERENCE TO RELATED APPLICATION

This application is based upon and claims the benefit of from Japanese Patent Application No. 2021-191334, priority filed Nov. 25, 2021, the entire contents of which are incorporated herein by reference.

FIELD

Embodiments described herein relate generally to a semiconductor device and a method for manufacturing the same.

BACKGROUND

In a three-dimensional semiconductor memory, there can be a problem that the charge stored in the charge storage layer of a memory cell escapes to the outside of the charge storage layer or to another memory cell.

DESCRIPTION OF THE DRAWINGS

FIGS. 11A and 11B are cross-sectional views (1/2) showing details of the method for manufacturing the semiconductor device of the first embodiment.

FIGS. 12A and 12B are cross-sectional views (2/2) showing details of the method for manufacturing the semiconductor device of the first embodiment;

FIGS. 13A to 13C are graphs (1/3) showing examples of an F concentration profile in the semiconductor device of the first embodiment.

DETAILED DESCRIPTION

Figure 1:
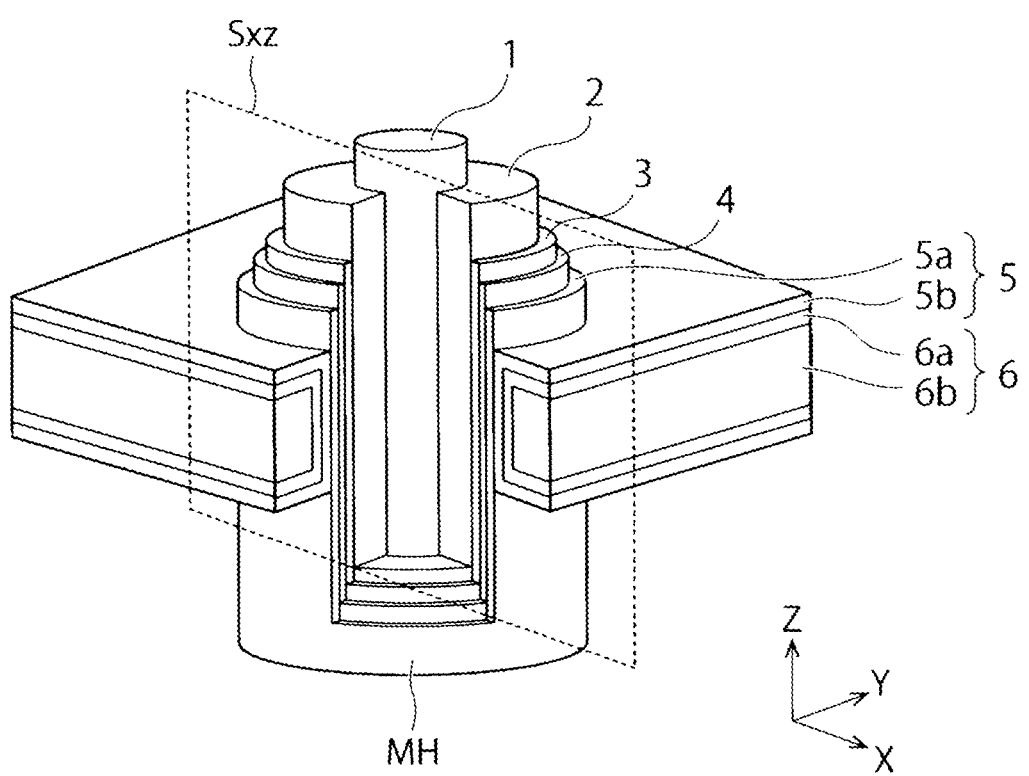
FIG. 1 is a perspective view showing a structure of a semiconductor device of a first embodiment.

At least one embodiment provides a semiconductor device capable of preventing charge from escaping from a charge storage layer, and a method for manufacturing the same.

In general, according to at least one embodiment, a semiconductor device includes a plurality of electrode layers separated from each other in a first direction, a charge storage layer provided on side surfaces of the plurality of electrode layers via a first insulating film, and a semiconductor layer provided on a side surface of the charge storage layer via a second insulating film. The charge storage layer includes a location having a fluorine concentration of $5.0 \times 10^{18}$ atoms/cm$^3$ or less. A fluorine concentration at an interface between the charge storage layer and the second insulating film is 10 times or more or 1/10 or less of a fluorine concentration at an interface between the charge storage layer and the first insulating film.

Hereinafter, embodiments of the present disclosure will be described with reference to the drawings. In FIGS. 1 to 17, the same components are designated by the same reference numerals and duplicate descriptions will be omitted.

First Embodiment

FIG. 1 is a perspective view showing a structure of a semiconductor device of a first embodiment. The semiconductor device of FIG. 1 includes, for example, a three-dimensional semiconductor memory.

The semiconductor device of FIG. 1 includes a core insulating film 1, a channel semiconductor layer 2, a tunnel insulating film 3, a charge storage layer 4, a block insulating film 5, and an electrode layer 6. The block insulating film 5 includes an insulating film 5a and an insulating film 5b. The electrode layer 6 includes a barrier metal layer 6a and an electrode material layer 6b. The insulating film 5a, the tunnel insulating film 3, and the insulating film 5b are examples of a first insulating film, a second insulating film, and a third insulating film, respectively. The channel semiconductor layer 2 is an example of a semiconductor layer.

In FIG. 1, a plurality of electrode layers and a plurality of insulating films are alternately stacked on a substrate, and a memory hole MH is provided in these electrode layers and insulating films. FIG. 1 shows one electrode layer 6 among these electrode layers. These electrode layers function, for example, as word lines of the three-dimensional semiconductor memory. FIG. 1 shows X and Y directions parallel to a surface of the substrate and perpendicular to each other, and a Z direction perpendicular to the surface of the substrate. In the present specification, a +Z direction is treated as an upward direction and a −Z direction is treated as a downward direction. The −Z direction may or may not coincide with a direction of gravity. The Z direction is an example of the first direction, and the X direction is an example of a second direction.

The core insulating film 1, the channel semiconductor layer 2, the tunnel insulating film 3, the charge storage layer 4, and the insulating film 5a are formed in the memory hole MH and configure a memory cell of the three-dimensional semiconductor memory. The insulating film 5a is formed on surfaces of the plurality of electrode layers and the plurality of insulating films in the memory hole MH, and the charge storage layer 4 is formed on a surface of the insulating film 5a. The charge storage layer 4 can store a signal charge of the three-dimensional semiconductor memory. The tunnel insulating film 3 is formed on a surface of the charge storage layer 4 and the channel semiconductor layer 2 is formed on a surface of the tunnel insulating film 3. The channel semiconductor layer 2 functions as a channel of the memory cell. The core insulating film 1 is formed in the channel semiconductor layer 2.

The insulating film 5a contains, for example, Si (silicon) and O (oxygen). The insulating film 5a is, for example, a $SiO_2$ film (silicon oxide film). The charge storage layer 4 contains, for example, Si (silicon) and N (nitrogen). The charge storage layer 4 is, for example, an insulating film such as a SiN film (silicon nitride film). The tunnel insulating film 3 contains, for example, Si (silicon), O (oxygen), and N (nitrogen), or contains Si (silicon) and O (oxygen). The tunnel insulating film 3 is, for example, a SiON film (silicon oxynitride film) or the $SiO_2$ film. The channel semiconductor layer 2 contains, for example, Si (silicon). The channel semiconductor layer 2 is, for example, a polysilicon layer. The core insulating film 1 contains, for example, Si (silicon) and O (oxygen). The core insulating film 1 is, for example, the $SiO_2$ film.

The insulating film 5b, the barrier metal layer 6a, and the electrode material layer 6b are sequentially formed between two insulating films adjacent to each other in the Z direction and formed on a lower surface of an upper insulating film, an upper surface of a lower insulating film, and a side surface of the insulating film 5a. The insulating film 5b contains, for example, Al (aluminum) and O (oxygen). The insulating film 5b is, for example, a metal insulating film such as an $Al_2O_3$ film (aluminum oxide film). The barrier metal layer 6a contains, for example, Ti (titanium) and N (nitrogen). The barrier metal layer 6a is, for example, a TiN film (titanium nitride film). The electrode material layer 6b contains, for example, W (tungsten). The electrode material layer 6b is, for example, a W (tungsten) layer.

Figure 2:
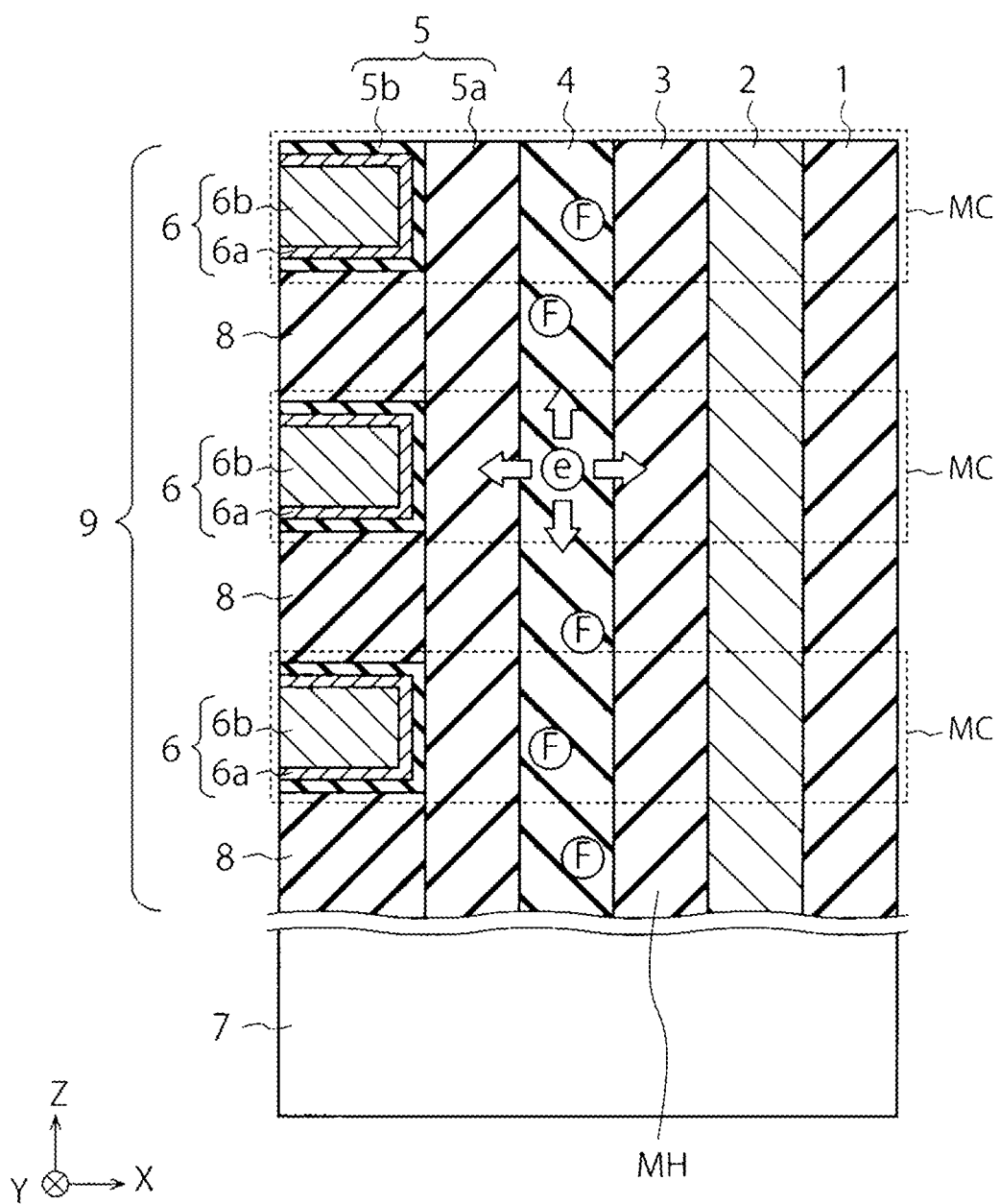
FIG. 2 is a cross-sectional view showing the structure of the semiconductor device of the first embodiment.

FIG. 2 is a cross-sectional view showing the structure of the semiconductor device of the first embodiment. FIG. 2 is a vertical cross-sectional view of an XZ cross-section Sxz shown in FIG. 1.

FIG. 2 shows a vertical cross-section of the memory hole MH shown in FIG. 1. As described with reference to FIG. 1, the semiconductor device of at least one embodiment includes a plurality of electrode layers 6 and a plurality of insulating films 8 alternately stacked on a substrate 7 (FIG. 2). As shown in FIG. 2, these electrode layers 6 are separated from each other in the Z direction. Each electrode layer 6 includes the barrier metal layer 6a and the electrode material layer 6b described above. The substrate 7 is, for example, a semiconductor substrate such as a Si (silicon) substrate. Each insulating film 8 is, for example, an $SiO_2$ film. The plurality of electrode layers 6 and the plurality of insulating films 8 configure a stacked film 9.

The insulating film 5a, the charge storage layer 4, the tunnel insulating film 3, the channel semiconductor layer 2, and the core insulating film 1 are sequentially formed on a side surface of the stacked film 9 in the memory hole MH, that is, on the side surfaces of the plurality of electrode layers 6 and the plurality of insulating films 8 in the memory hole MH. The barrier metal layer 6a and the electrode material layer 6b in each electrode layer 6 are sequentially formed on a lower surface of an upper insulating film 8, an upper surface of a lower insulating film 8, and the side surface of the insulating film 5a via the insulating film 5b.

FIG. 2 shows a plurality of memory cells MC of the semiconductor device of at least one embodiment. As shown in FIG. 2, each memory cell MC includes the core insulating film 1, the channel semiconductor layer 2, the tunnel insulating film 3, the charge storage layer 4, the block insulating film 5, and the corresponding electrode layer 6. As shown schematically in FIG. 2, each memory cell MC can store the signal charge in the charge storage layer 4.

Next, with reference to FIG. 2, fluorine (F) contained in the charge storage layer 4 of at least one embodiment will be described.

As schematically shown in FIG. 2, the charge storage layer 4 of at least one embodiment contains F atoms as impurity atoms. Before forming the charge storage layer 4 in a chamber, the inside of the chamber may be cleaned with a cleaning gas. This cleaning gas often contains an F component, such as a $F_2$ (fluorine) gas and a HF (hydrogen fluoride) gas. As a result, when the charge storage layer 4 is formed in the chamber after cleaning the chamber, the F component remaining in the chamber often enters the charge storage layer 4. FIG. 2 shows F atoms that enter the charge storage layer 4 in this way.

Further, the gas in a FOUP (Front Opening Unified Pod) that carries the substrate 7 may also contain the F component. In this case, the F component in the FOUP may enter the charge storage layer 4.

Due to these reasons, the charge storage layer 4 may contain F atoms. In this case, even if there is no step of using a process gas or a process liquid (for example, a source gas, an oxidizing agent, a reducing agent, an etching solution, etc.) containing F atoms when manufacturing the semiconductor device of at least one embodiment, F atoms enter the charge storage layer 4. As will be described later, F atoms may also enter a portion other than the charge storage layer 4 (for example, the tunnel insulating film 3 or the insulating film 5a) in the semiconductor device of at least one embodiment.

When F atoms enter the charge storage layer 4 in this way, a concentration of F atoms in the charge storage layer 4 (hereinafter, referred to as an "F concentration") is generally high. Generally, the F concentration in the charge storage layer 4 in this case is about $1.0 \times 10^{20}$ atoms/cm$^3$. When the F concentration in the charge storage layer 4 becomes high, the signal charge is likely to escape from the charge storage layer 4. As a result, the charge retention characteristics of each memory cell MC may deteriorate.

FIG. 2 schematically shows how the signal charge escapes from the charge storage layer 4. As shown in FIG. 2, the signal charge stored in the charge storage layer 4 of each memory cell MC may escape to the outside of the charge storage layer 4 of the memory cell MC or to another memory cell MC. Generally, when F atoms enter the charge storage layer 4, a shallow trap is generated in the charge storage layer 4. In this case, if the signal charge in the charge storage layer 4 is captured by the shallow trap, the signal charge is likely to escape to the outside of the charge storage layer 4. Therefore, when the F concentration in the charge storage layer 4 becomes high, the signal charge is likely to escape from the charge storage layer 4.

Therefore, when manufacturing the semiconductor device of at least one embodiment, a process of reducing the F concentration in the charge storage layer 4 is performed, as will be described later. This makes it possible to prevent the signal charge from escaping from the charge storage layer 4.

The F concentration in the charge storage layer 4 of the present embodiment is set to $5.0 \times 10^{18}$ atoms/cm$^3$ or less, entirely or partially. For example, when the F concentration in the charge storage layer 4 is uniform, the F concentration in all the locations in the charge storage layer 4 is set to the same value of $5.0 \times 10^{18}$ atoms/cm$^3$ or less. On the other hand, when the F concentration in the charge storage layer 4 is non-uniform, the F concentration in all the locations in the charge storage layer 4 may be set to $5.0 \times 10^{18}$ atoms/cm$^3$ or less, or the F concentration in only a part of the charge storage layer 4 may be set to $5.0 \times 10^{18}$ atoms/cm$^3$ or less. Various examples of such F concentration will be described later with reference to FIGS. 13A to 15D.

The F concentration in the charge storage layer 4 of at least one embodiment is set to a high concentration at an interface between the charge storage layer 4 and the tunnel insulating film 3 and is set to a low concentration at an interface between the charge storage layer 4 and the insulating film 5a, for example. For example, an F concentration at the interface between the charge storage layer 4 and the tunnel insulating film 3 is set to be 10 times or more an F concentration at the interface between the charge storage layer 4 and the insulating film 5a (FIG. 13B, etc.). Such F concentration can be implemented by removing F atoms near the interface between the charge storage layer 4 and the insulating film 5a.

On the other hand, the F concentration in the charge storage layer 4 of at least one embodiment may be set to a low concentration at the interface between the charge storage layer 4 and the tunnel insulating film 3 and may be set to a high concentration at the interface between the charge storage layer 4 and the insulating film 5a. For example, the F concentration at the interface between the charge storage layer 4 and the tunnel insulating film 3 may be set to 1/10 or less of the F concentration at the interface between the charge storage layer 4 and the insulating film 5a (FIG. 13C, etc.). Such F concentration can be implemented by removing F atoms near the interface between the charge storage layer 4 and the tunnel insulating film 3.

For example, when the F concentration at the interface between the charge storage layer 4 and the tunnel insulating film 3 is a maximum value and the F concentration at the interface between the charge storage layer 4 and the insulating film 5a is a minimum value, the F concentration of the former is 10 times or more the F concentration of the latter. In this case, the F concentration of the latter is 1/10 or less of the F concentration of the former. In this case, a maximum value of the F concentration in the charge storage layer 4 is 10 times or more a minimum value of the F concentration in the charge storage layer 4.

Figure 3:
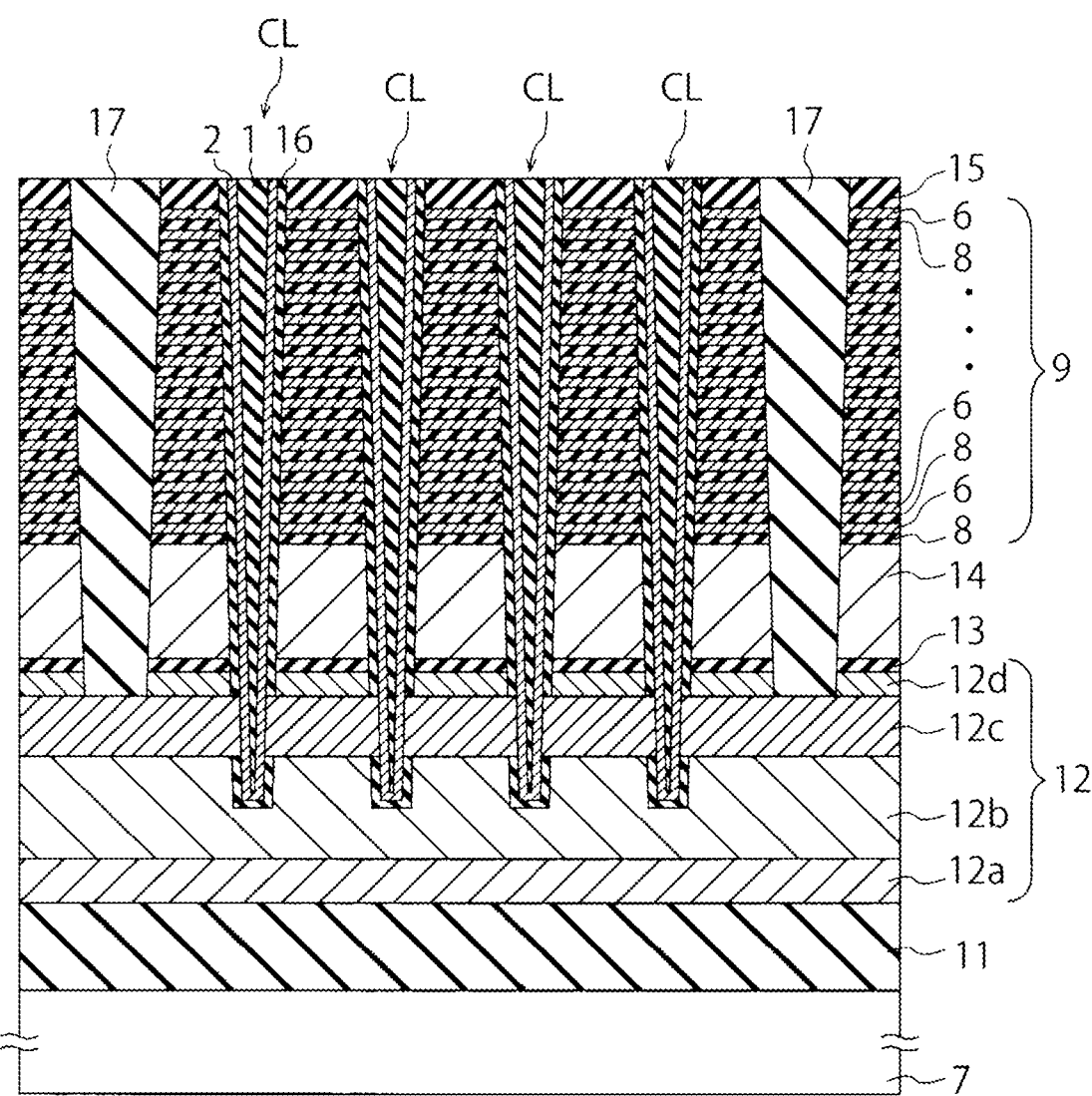
FIG. 3 is a cross-sectional view showing details of the structure of the semiconductor device of the first embodiment.

FIG. 3 is a cross-sectional view showing the details of the structure of the semiconductor device of the first embodiment.

FIG. 3 shows a plurality of columnar portions CL having a structure similar to a structure in the memory hole MH shown in FIG. 2. The semiconductor device of at least one embodiment includes an interlayer insulating film 11, a source layer 12, an interlayer insulating film 13, a gate layer 14, an interlayer insulating film 15, a plurality of memory insulating films 16, and a plurality of slit insulating films 17, in addition to components shown in FIG. 2. The source layer 12 includes a metal layer 12a, a lower semiconductor layer 12b, an intermediate semiconductor layer 12c, and an upper semiconductor layer 12d.

The interlayer insulating film 11, the source layer 12, the interlayer insulating film 13, the t gate layer 14, the stacked film 9, and the interlayer insulating film 15 are sequentially formed on the substrate 7. The interlayer insulating film 11 is, for example, an SiO$_2$ film. The source layer 12 includes the metal layer 12a (e.g., W layer), the lower semiconductor layer 12b (e.g., polysilicon layer), the intermediate semiconductor layer 12c (e.g., polysilicon layer), and the upper semiconductor layer 12d (e.g., polysilicon layer), which are sequentially formed on the interlayer insulating film 11. The interlayer insulating film 13 is, for example, an SiO$_2$ film. The gate layer 14 is, for example, the polysilicon layer. The interlayer insulating film 15 is, for example, an SiO$_2$ film. The insulating film 5b in the stacked film 9 is not shown.

Each columnar portion CL has a columnar shape extending in the Z direction and is formed in the lower semiconductor layer 12b, the intermediate semiconductor layer 12c, the upper semiconductor layer 12d, the interlayer insulating film 13, the gate layer 14, the stacked film 9, and the interlayer insulating film 15. Each columnar portion CL includes the memory insulating film 16, the channel semiconductor layer 2, and the core insulating film 1 in this order. The memory insulating film 16 in each columnar portion CL includes the above-mentioned insulating film 5a, the charge storage layer 4, and the tunnel insulating film 3 in this order (see FIG. 2). The channel semiconductor layer 2 in each columnar portion CL is in contact with the intermediate semiconductor layer 12c and is electrically connected to the source layer 12.

Each slit insulating film 17 has a plate-like shape extending in the Z direction and the Y direction and is formed in the upper semiconductor layer 12d, the interlayer insulating film 13, the gate layer 14, the stacked film 9, and the interlayer insulating film 15. Each slit insulating film 17 is, for example, an SiO$_2$ film.

FIGS. 4A to 10B are cross-sectional views showing a method for manufacturing the semiconductor device of the first embodiment.

Figure 4A:
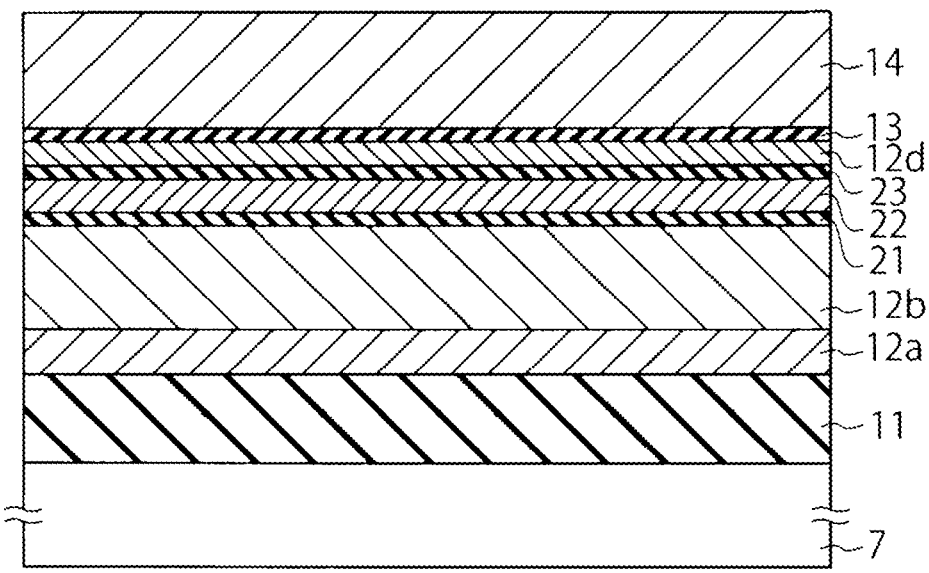
FIGS. 4A and 4B are cross-sectional views (1/7) showing a method for manufacturing the semiconductor device of the first embodiment.

First, the interlayer insulating film 11, the metal layer 12a, the lower semiconductor layer 12b, a lower protective film 21, a sacrifice layer 22, an upper protective film 23, the upper semiconductor layer 12d, the interlayer insulating film 13, and the gate layer 14 are sequentially formed on the substrate 7 (FIG. 4A). The lower protective film 21 is, for example, an SiO$_2$ film. The sacrifice layer 22 is, for example, the polysilicon layer. The upper protective film 23 is, for example, an SiO$_2$ film.

Figure 4B:
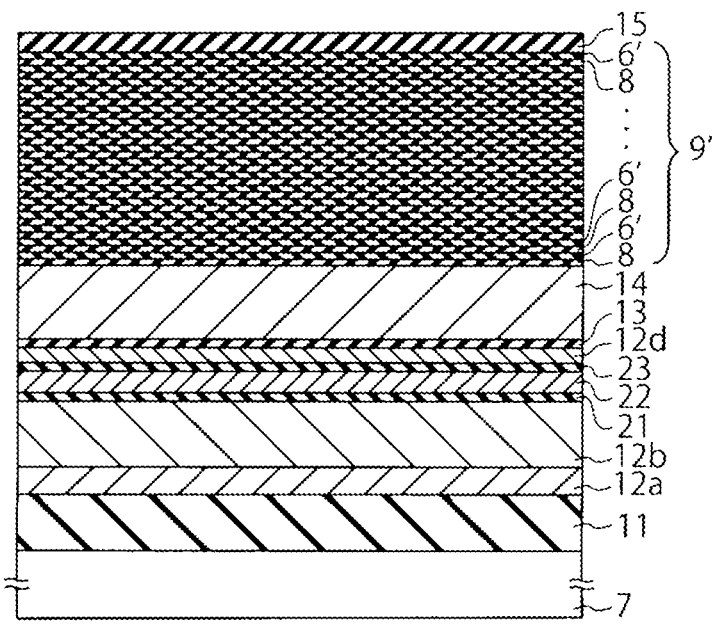

Next, a stacked film 9' including a plurality of sacrifice layers 6' and the plurality of insulating films 8 alternately is formed on the gate layer 14, and the interlayer insulating film 15 is formed on the stacked film 9' (FIG. 4B). Each sacrifice layer 6' is, for example, an SiN film. These sacrifice layers 6' are separated from each other in the Z direction. These sacrifice layers 6' are examples of a first layer.

Figure 5A:
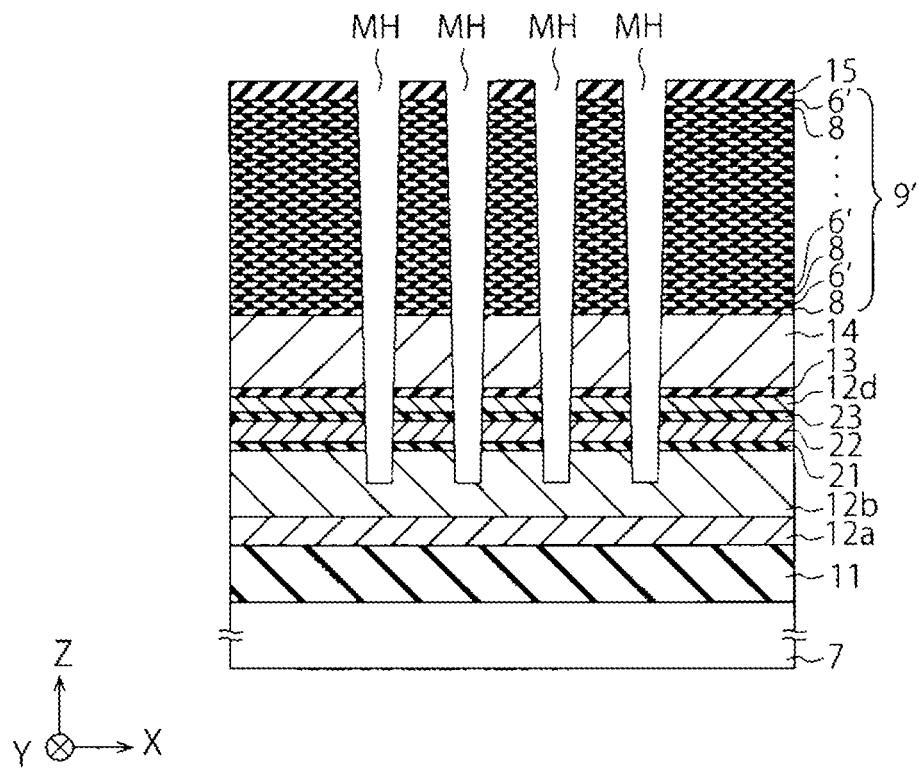
FIGS. 5A and 5B are cross-sectional views (2/7) showing the method for manufacturing the semiconductor device of the first embodiment.

Next, by photolithography and RIE (Reactive Ion Etching), a plurality of memory holes MH are formed in the interlayer insulating film 15, the stacked film 9', the gate layer 14, the interlayer insulating film 13, the upper semiconductor layer 12d, the upper protective film 23, the sacrifice layer 22, the lower protective film 21, and the lower semiconductor layer 12b (FIG. 5A).

Figure 5B:
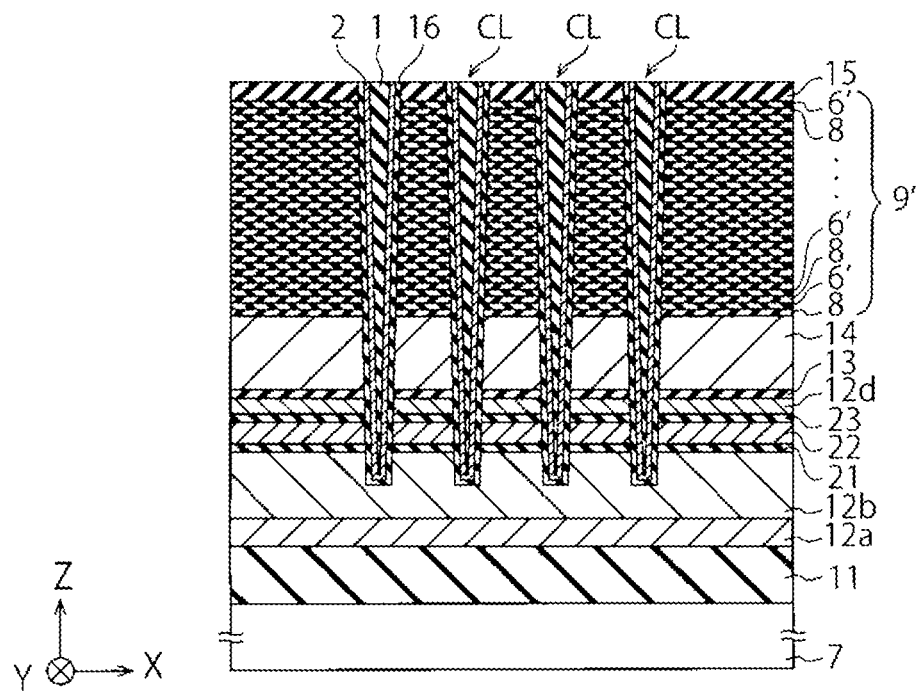

Next, the memory insulating film 16, the channel semiconductor layer 2, and the core insulating film 1 are sequentially formed in these memory holes MH (FIG. 5B). As a result, the plurality of columnar portions CL are formed in these memory holes MH. The memory insulating film 16 is formed by forming the insulating film 5a, the charge storage layer 4, and the tunnel insulating film 3 in this order in each memory hole MH (see FIG. 2). At this time, in at least one embodiment, F atoms enter the charge storage layer 4 and the F concentration in the charge storage layer 4 becomes high.

Figure 6A:
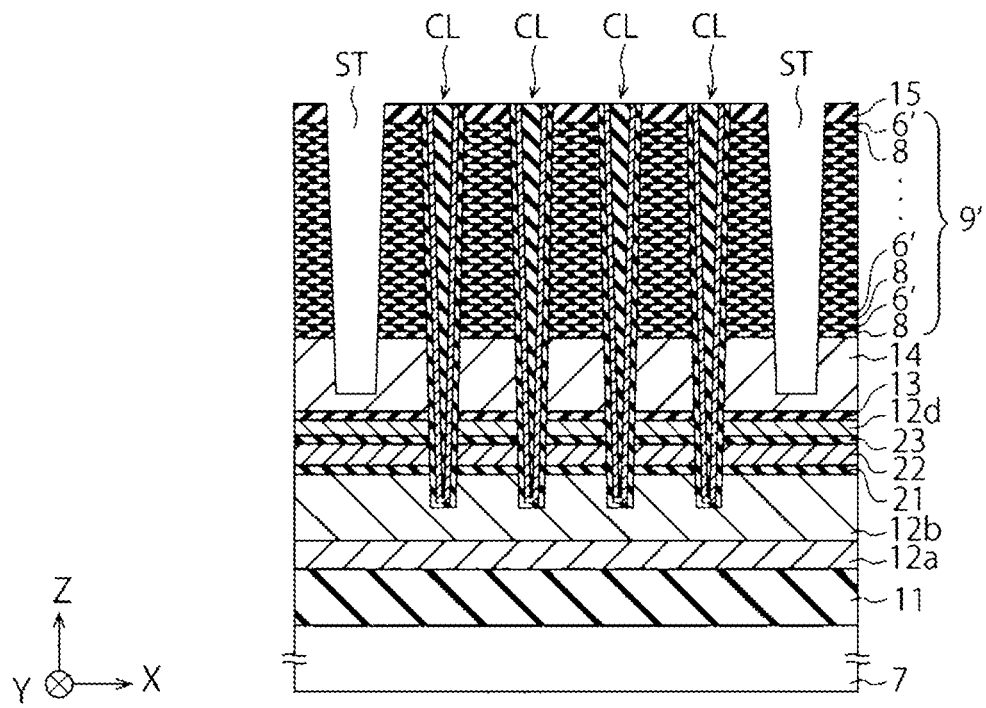
FIGS. 6A and 6B are cross-sectional views (3/7) showing the method for manufacturing the semiconductor device of the first embodiment.
Figure 6B:
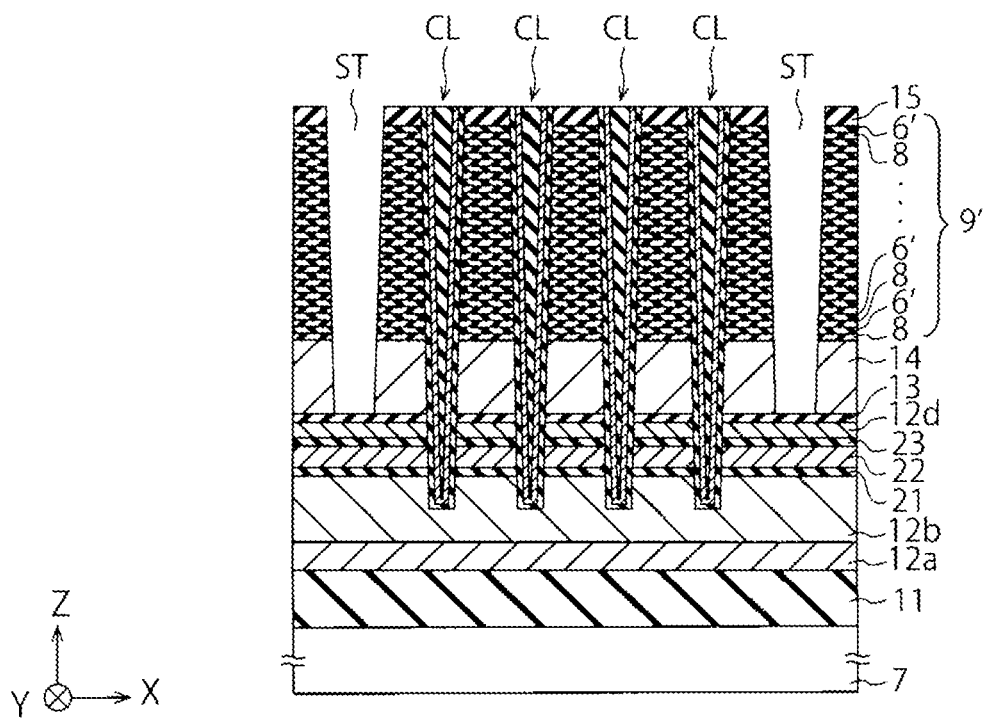
Figure 7A:
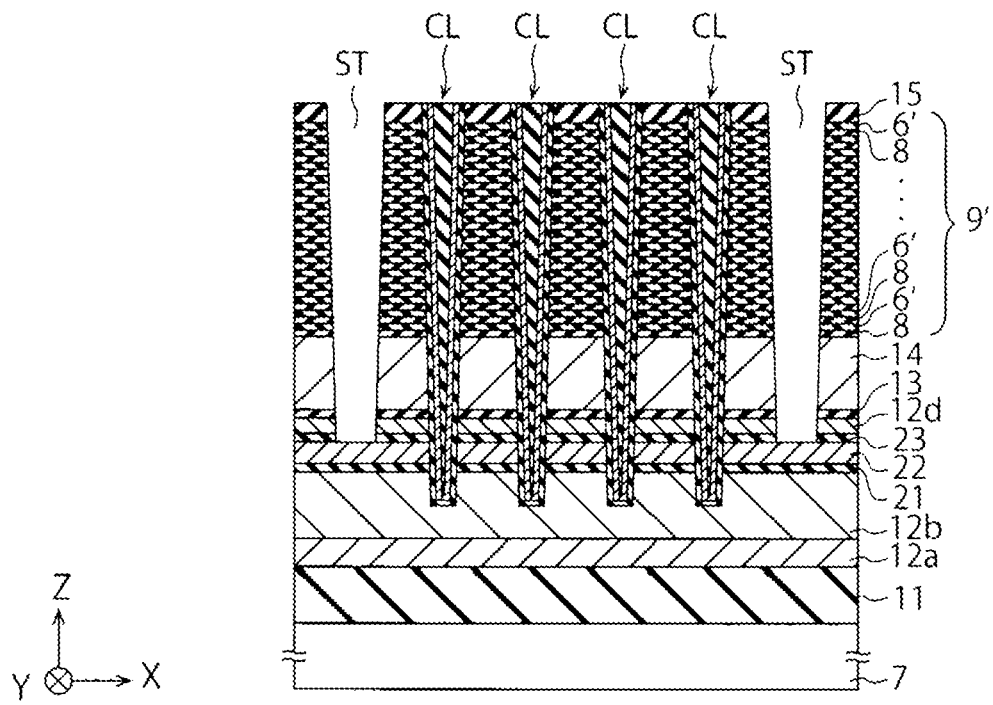
FIGS. 7A and 7B are cross-sectional views (4/7) showing the method for manufacturing the semiconductor device of the first embodiment.
Figure 7B:
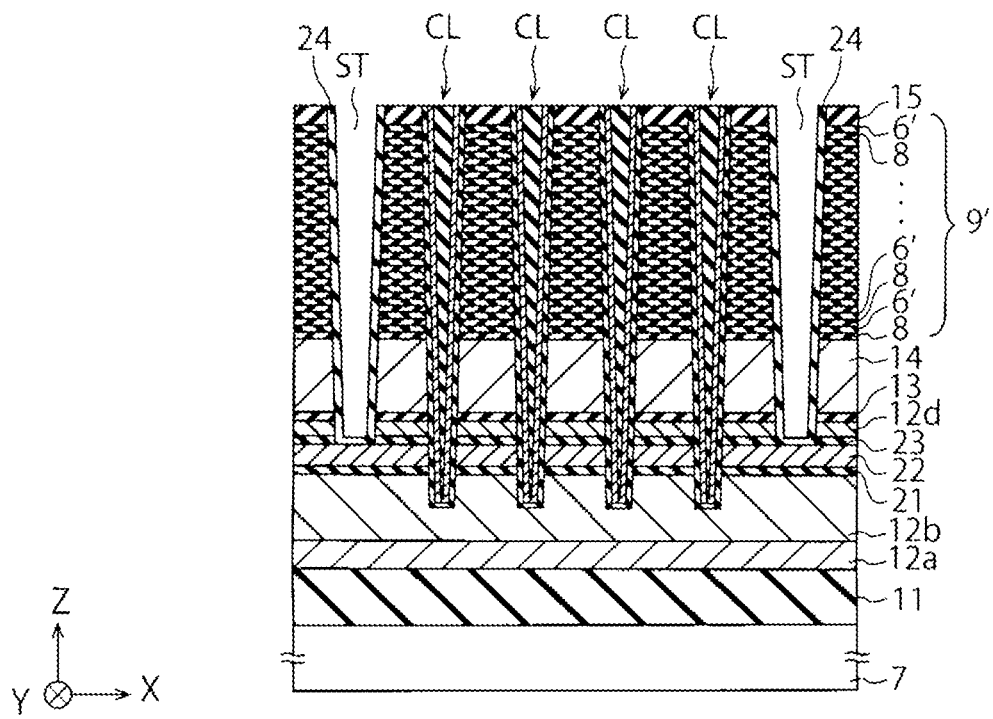

Next, a plurality of slits ST are formed in the interlayer insulating film 15, the stacked film 9', and the gate layer 14 by the photolithography and the RIE (FIGS. 6A and 6B). The RIE is performed using a first etching gas in the step shown in FIG. 6A, and is performed using a second etching gas different from the first etching gas in the step shown in FIG. 6B.

Figure 8A:
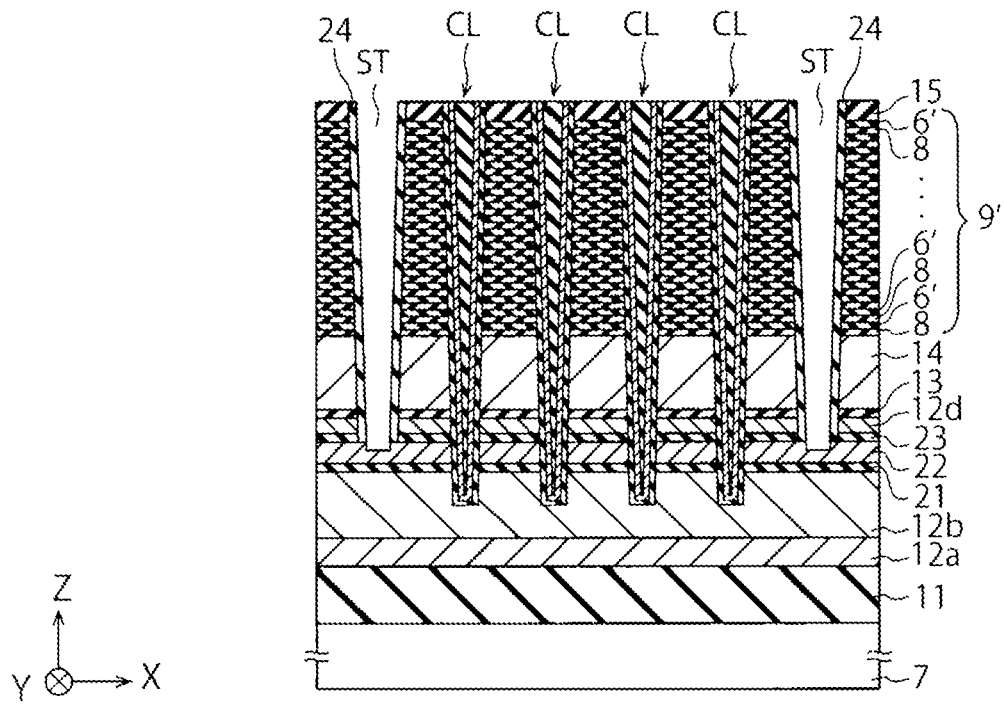
FIGS. 8A and 8B are cross-sectional views (5/7) showing the method for manufacturing the semiconductor device of the first embodiment.

Next, the upper protective film 23 is removed from a bottom surface of a slit ST by etching (FIG. 7A), a liner layer 24 is formed on a surface of the slit ST (FIG. 7B), and the liner layer 24 is removed from the bottom surface of the slit ST by etching (FIG. 8A). As a result, a side surface of the slit ST is protected by the liner layer 24, while the sacrifice layer 22 is exposed on the bottom surface of the slit ST. The liner layer 24 is, for example, an SiN film.

Figure 8B:
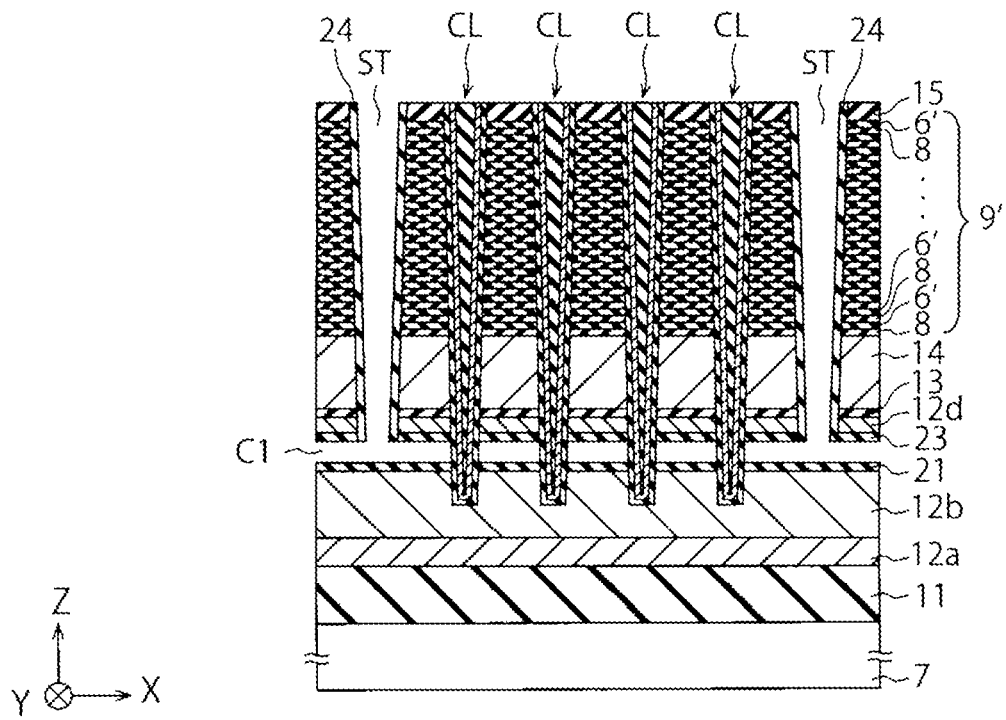

Next, the sacrifice layer 22 is removed by wet etching using the slit ST (FIG. 8B). As a result, a cavity C1 is formed between the lower protective film 21 and the upper protective film 23, and the memory insulating film 16 is exposed on a side surface of the cavity C1.

Figure 9A:
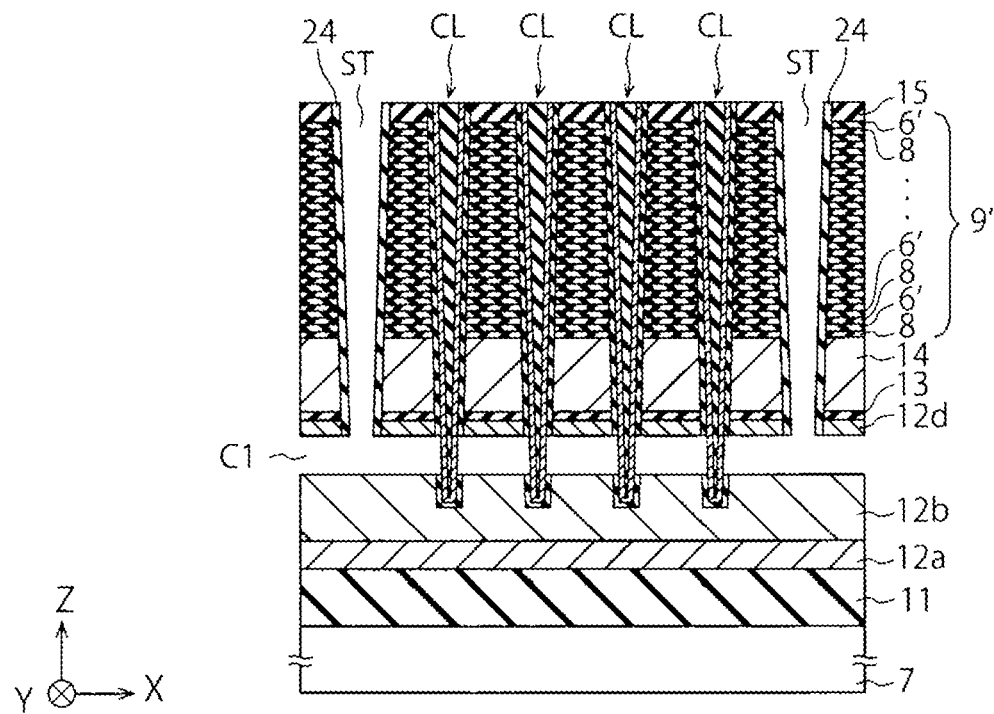
FIGS. 9A and 9B are cross-sectional views (6/7) showing the method for manufacturing the semiconductor device of the first embodiment.

Next, the lower protective film 21, the upper protective film 23, and the memory insulating film 16 exposed on the side surface of the cavity C1 are removed by CDE (Chemical Dry Etching) using the slit ST (FIG. 9A). As a result, the upper semiconductor layer 12*d* is exposed on an upper surface of the cavity C1, the lower semiconductor layer 12*b* is exposed on a lower surface of the cavity C1, and the channel semiconductor layer 2 is exposed on the side surface of the cavity C1.

Figure 9B:
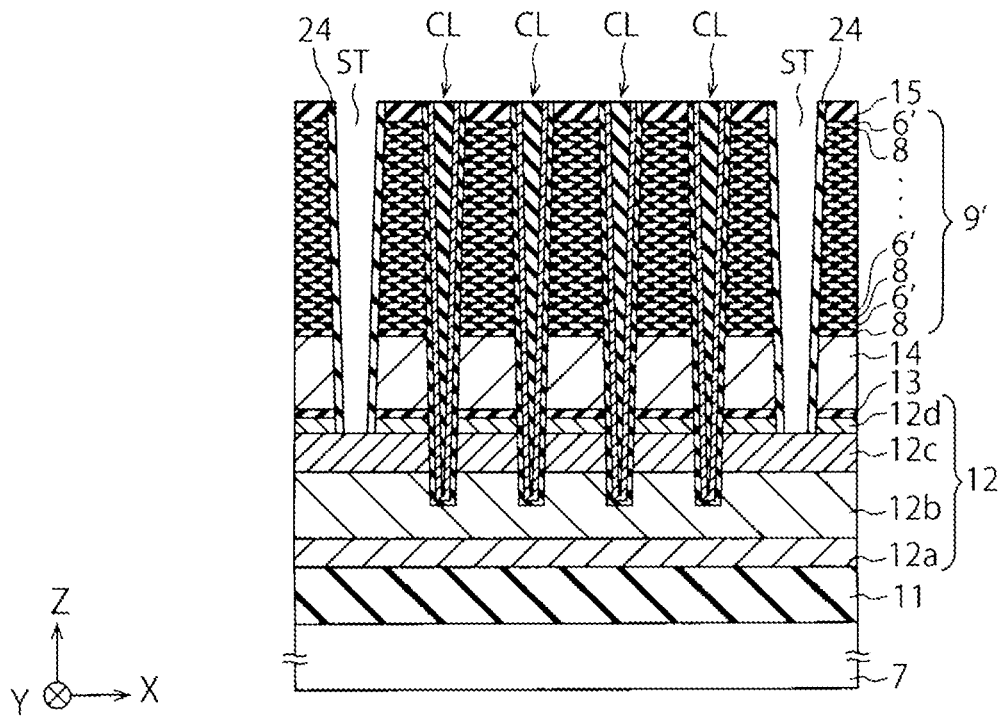

Next, the intermediate semiconductor layer 12*c* is formed in the cavity C1 by forming the intermediate semiconductor layer 12*c* on the surfaces of the upper semiconductor layer 12*d*, the lower semiconductor layer 12*b*, and the channel semiconductor layer 2, which are exposed in the cavity C1 (FIG. 9B). As a result, the intermediate semiconductor layer 12*c* in contact with the upper semiconductor layer 12*d*, the lower semiconductor layer 12*b*, and the channel semiconductor layer 2 are formed between the upper semiconductor layer 12*d* and the lower semiconductor layer 12*b*.

Figure 10A:
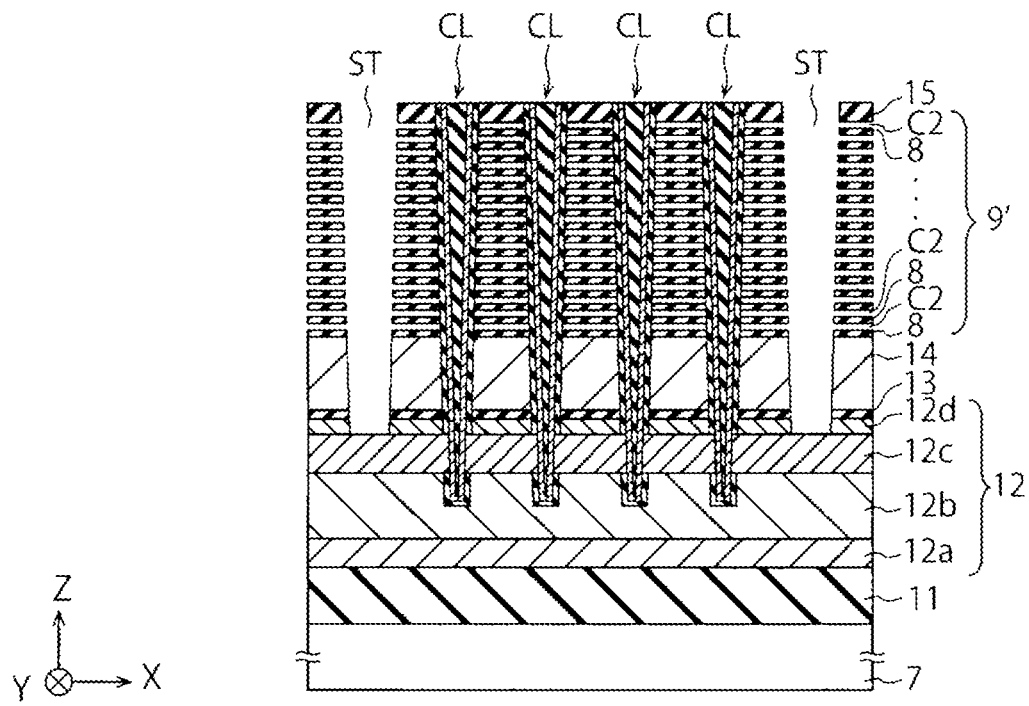
FIGS. 10A and 10B are cross-sectional views (7/7) showing the method for manufacturing the semiconductor device of the first embodiment.

Next, the liner layer 24 in the slit ST and each sacrifice layer 6' in the stacked film 9' are removed by wet etching or dry etching using the slit ST (FIG. 10A). As a result, a plurality of cavities C2 are formed between the insulating films 8 in the stacked film 9'. These cavities C2 are examples of a first recess portion.

Figure 10B:
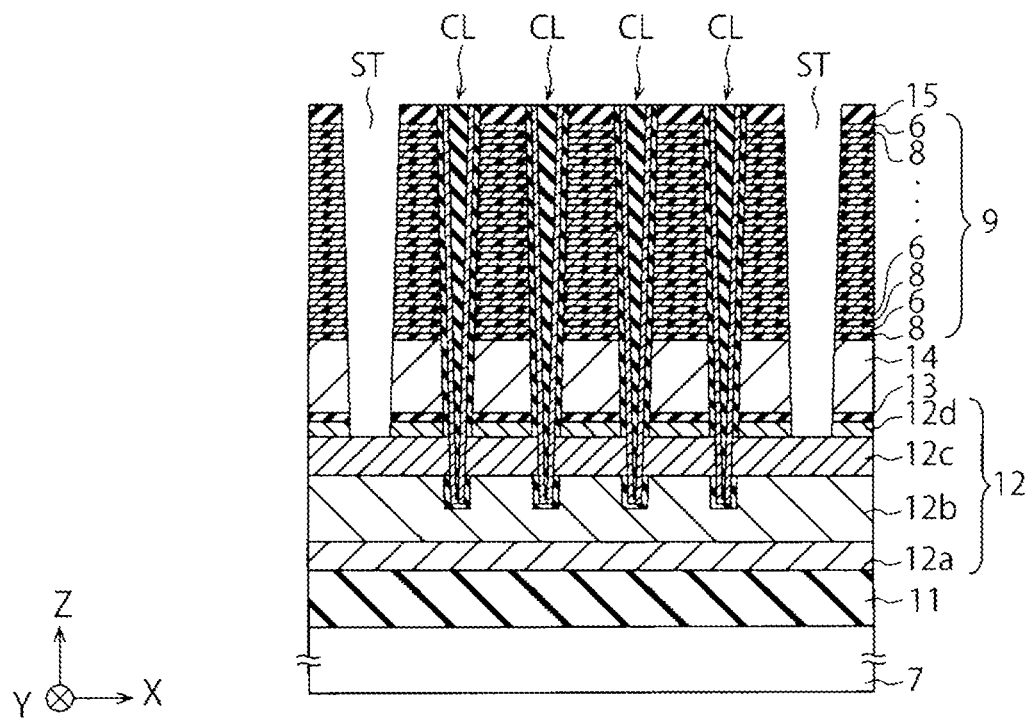

Next, the plurality of electrode layers 6 are formed in these cavities C2 by CVD (Chemical Vapor Deposition) (FIG. 10B). As a result, the stacked film 9 including the plurality of electrode layers 6 and the plurality of insulating films 8 alternately is formed between the gate layer 14 and the interlayer insulating film 15. In this way, the plurality of sacrifice layers 6' are replaced with the plurality of electrode layers 6. In the step shown in FIG. 10B, the insulating film 5*b*, the barrier metal layer 6*a*, and the electrode material layer 6*b* are sequentially formed in each cavity C2 (see FIG. 2).

After that, the slit insulating film 17 is formed in each slit ST. Further, various plug layers, wiring layers, interlayer insulating films, and the like are formed on the substrate 7. In this way, the semiconductor device shown in FIG. 3 is manufactured.

When manufacturing the semiconductor device of the present embodiment, a process of reducing the F concentration in the charge storage layer 4 is performed between the step shown in FIG. 10A and the step shown in FIG. 10B. Details of this process will be described later with reference to FIGS. 11A to 12B.

FIGS. 11A to 12B are cross-sectional views showing details of the method for manufacturing the semiconductor device of the first embodiment.

FIG. 11A shows an insulating film 31 formed at a bottom portion of the slit ST in addition to components shown in FIG. 10A. First, after performing the step shown in FIG. 10A, annealing is performed using a gas G1 (FIG. 11A). The annealing shown in FIG. 11A is, for example, thermal annealing using a gas containing N (nitrogen) and O (oxygen) as the gas G1. The gas G1 is, for example, a $N_2O$ (nitrous oxide) gas. The thermal annealing is, for example, RT (Rapid Thermal) annealing. The gas G1 is supplied to the charge storage layer 4 through the slit ST and the cavity C2. As a result, some of F atoms in the charge storage layer 4 are removed from the charge storage layer 4 by the action of the gas G1, and the F concentration in the charge storage layer 4 decreases. As described above, according to at least one embodiment, it is possible to reduce the F concentration in the charge storage layer 4 by the annealing shown in FIG. 11A.

Next, the insulating film 5*b* is formed in each cavity C2 (FIG. 11B). The insulating film 5*b* is, for example, an $AlO_x$ film (aluminum oxide film).

Next, annealing is performed using a gas G2 (FIG. 12A). The annealing shown in FIG. 12A is, for example, the thermal annealing using the gas containing N (nitrogen) and O (oxygen) as the gas G2. The gas G2 is, for example, an $N_2O$ gas. The thermal annealing is, for example, an RT annealing. The gas G2 is supplied to the charge storage layer 4 through the slit ST and the cavity C2. As a result, some of F atoms in the charge storage layer 4 are removed from the charge storage layer 4 by the action of the gas G2, and the F concentration in the charge storage layer 4 is further reduced. As described above, according to at least one embodiment, the F concentration in the charge storage layer 4 can be further reduced by the annealing shown in FIG. 12A. Further, according to at least one embodiment, the insulating film 5*b* can be modified by the annealing shown in FIG. 12A.

Next, the barrier metal layer 6*a* and the electrode material layer 6*b* are sequentially formed in each cavity C2 (FIG. 12B). As a result, the electrode layer 6 is formed in each cavity C2 via the insulating film 5*b*.

After that, the slit insulating film 17 is formed in each slit ST. Further, various plug layers, wiring layers, interlayer insulating films, and the like are formed on the substrate 7. In this way, the semiconductor device shown in FIG. 3 is manufactured.

The gas G1 may be a gas other than the $N_2O$ gas or may be a mixed gas containing the $N_2O$ gas and another gas. For example, the gas G1 may be a mixed gas containing the $N_2O$ gas and a $H_2$ (hydrogen) gas or may be a mixed gas containing the $N_2O$ gas and a $D_2$ (deuterium) gas. This also applies to the gas G2.

Next, the F concentration in the charge storage layer 4 of at least one embodiment will be described with reference to FIGS. 11A to 12B.

In at least one embodiment, when the charge storage layer 4 is formed in the step shown in FIG. 5B, F atoms enter the charge storage layer 4 and the F concentration in the charge storage layer 4 becomes high. Therefore, immediately before the annealing shown in FIG. 11A, the F concentration in the charge storage layer 4 is high. Specifically, immediately before the annealing shown in FIG. 11A, the F concentration in the charge storage layer 4 of at least one embodiment is higher than $5.0\times10^{18}$ atoms/cm$^3$ at any location in the charge storage layer 4. For example, immediately before the annealing shown in FIG. 11A, the F concentration in the charge storage layer 4 is about $1.0\times10^{20}$ atoms/cm$^3$ at any location in the charge storage layer 4.

In at least one embodiment, the F concentration in the charge storage layer 4 is reduced by performing the annealing shown in FIGS. 11A and 12A. As a result, locations having the F concentration of $5.0\times10^{18}$ atoms/cm$^3$ or less are generated in the charge storage layer 4. This makes it possible to prevent the signal charge from escaping from the charge storage layer 4. The locations having the F concentration of $5.0\times10^{18}$ atoms/cm$^3$ or less may be generated after the annealing shown in FIG. 11A or after the annealing shown in FIG. 12A.

The gases G1 and G2 are supplied to the charge storage layer 4 via the insulating film 5a. Therefore, the F concentration in the charge storage layer 4 decreases mainly near the interface between the charge storage layer 4 and the insulating film 5a. As a result, the F concentration at the interface between the charge storage layer 4 and the tunnel insulating film 3 becomes 10 times or more the F concentration at the interface between the charge storage layer 4 and the insulating film 5a (see FIG. 13B and the like). In at least one embodiment, the F concentration at the interface between the charge storage layer 4 and the insulating film 5a is $5.0\times10^{18}$ atoms/cm$^3$ or less.

In at least one embodiment, only one of the annealing shown in FIG. 11A and the annealing shown in FIG. 12A may be performed. In this case, the annealing shown in FIG. 11A or FIG. 12A is performed so that the locations having the F concentration of $5.0\times10^{18}$ atoms/cm$^3$ or less are generated in the charge storage layer 4 by this annealing.

Further, the annealing using the N$_2$O gas may be performed in the step shown in FIG. 5B instead of the step shown in FIG. 11A and/or FIG. 12A. In this case, the annealing using the N$_2$O gas is performed after formation of the charge storage layer 4 and before the memory hole MH is completely embedded. The N$_2$O gas is supplied to the charge storage layer 4 via the tunnel insulating film 3. Therefore, the F concentration in the charge storage layer 4 mainly decreases near an inner peripheral surface of the charge storage layer 4, which is the interface between the charge storage layer 4 and the tunnel insulating film 3. As a result, the F concentration at the interface between the charge storage layer 4 and the tunnel insulating film 3 is 1/10 or less of the F concentration at the interface between the charge storage layer 4 and the insulating film 5a (see FIG. 13C and the like). In this case, the F concentration at the interface between the charge storage layer 4 and the tunnel insulating film 3 is $5.0\times10^{18}$ atoms/cm$^3$ or less.

Further, the annealing using the N$_2$O gas may be performed in both the steps shown in FIGS. 11A and/or 12A and the step shown in FIG. 5B. In this case, the F concentration in the charge storage layer 4 decreases near the inner peripheral surface of the charge storage layer 4 (the interface between the charge storage layer 4 and the tunnel insulating film 3) as well as near an outer peripheral surface of the charge storage layer 4 (the interface between the charge storage layer 4 and the insulating film 5b). As a result, for example, as shown in FIG. 13A, it is possible to implement an F concentration distribution in which a difference in F concentration between the inner peripheral surface of the charge storage layer 4 and the outer peripheral surface of the charge storage layer 4 is smaller than that in FIGS. 13B and 13C. For example, an F concentration distribution of the charge storage layer 4 can be made uniform.

FIGS. 13A to 15D are graphs showing examples of an F concentration profile and the like in the semiconductor device of the first embodiment.
Example of FIG. 13A FIG. 13A shows an example of an F concentration profile in the charge storage layer 4. In FIG. 13A, a horizontal axis indicates an X coordinate of each location in the charge storage layer 4, and a vertical axis indicates the F concentration of each location in the charge storage layer 4 on a logarithmic scale (the same applies to FIG. 13B to FIG. 15A). FIG. 13A shows an F concentration profile along an X axis in an XZ cross-section of the charge storage layer 4 passing through a central axis of the memory hole MH (or columnar portion CL) (the same applies to FIGS. 13B to 15A).

FIG. 13A shows positions of an interface S1 between the charge storage layer 4 and the insulating film 5a, an interface S2 between the charge storage layer 4 and the tunnel insulating film 3, and an interface S3 between the channel semiconductor layer 2 and the tunnel insulating film 3. FIG. 13A further shows an F concentration K1 before the annealing shown in FIGS. 11A and 12A and an F concentration K2 after the annealing shown in FIGS. 11A and 12A.

In the example of FIG. 13A, the F concentration K1 in the charge storage layer 4 before annealing is high. The F concentration K1 is, for example, $1.0\times10^{20}$ atoms/cm$^3$ or more. On the other hand, the F concentration K2 in the charge storage layer 4 after annealing is low. The F concentration K2 is, for example, $5.0\times10^{18}$ atoms/cm$^3$ or less. Further, the F concentration K1 and the F concentration K2 may be uniform in the charge storage layer 4. Such F concentration profile can be implemented, for example, by performing annealing with the N$_2$O gas in both the steps shown in FIGS. 11A and/or 12A and the step shown in FIG. 5B. In this case, the F concentration K1 represents a concentration before annealing in the step shown in FIG. 5B.

The horizontal axis in FIG. 13A may be a coordinate other than the X coordinate and may be, for example, a Y coordinate of each location in the charge storage layer 4. In this case, FIG. 13A shows, for example, an F concentration profile along a Y axis in a YZ cross section of the charge storage layer 4 passing through the central axis of the memory hole MH (or columnar portion CL). This also applies to FIGS. 13B to 15A.
Example of FIG. 13B FIG. 13B shows the F concentration K1 in the charge storage layer 4 before the annealing shown in FIGS. 11A and 12A, an F concentration K3 in the tunnel insulating film 3 before the annealing shown in FIGS. 11A and 12A, and the F concentration K2 in the charge storage layer 4 and the tunnel insulation film 3 after the annealing shown in FIGS. 11A and 12A.

In the example of FIG. 13B, the F concentration K1 in the charge storage layer 4 before annealing is high, and the F concentration K2 in the tunnel insulating film 3 before annealing is low. The F concentration K1 is, for example, $1.0\times10^{20}$ atoms/cm$^3$ or more. The F concentration K3 is, for example, $5.0\times10^{18}$ atoms/cm$^3$ or less. Meanwhile, the F concentration K2 after annealing decreases in the charge storage layer 4 and increases in the tunnel insulating film 3. The F concentration K2 after annealing has a peak P in the charge storage layer 4, increases from the interface S1 to the peak P along the X direction, and decreases from the peak P to the interface S2. The location of the peak P is an example of a predetermined location.

In the example of FIG. 13B, the annealing using the $N_2O$ gas is performed in the steps shown in FIGS. 11A and 12A. Therefore, the F concentration in the charge storage layer 4 decreases mainly near the interface S1 between the charge storage layer 4 and the insulating film 5a. As a result, the F concentration at the interface S2 between the charge storage layer 4 and the tunnel insulating film 3 becomes 10 times or more the F concentration at the interface S1 between the charge storage layer 4 and the insulating film 5a. In the example of FIG. 13B, the F concentration at the interface S1 is $5.0 \times 10^{18}$ atoms/cm$^3$ or less, and the F concentration at the interface S2 and the peak P is $5.0 \times 10^{19}$ atoms/cm$^3$ or more. The signal charge in the charge storage layer 4 is generally stored near the surface of the charge storage layer 4. According to the example of FIG. 13B, since the F concentration at the interface S1 decreases, it is possible to suitably store the signal charge near the interface S1. Furthermore, SILC (Stress Induced Leakage Current) can be improved by termination by a Si—F bond.

In the example of FIG. 13B, the F concentration in the tunnel insulating film 3 is increased by annealing. The F concentration in the tunnel insulating film 3 after annealing is, for example, $1.0 \times 10^{19}$ atoms/cm$^3$ or more and $1.0 \times 10^{20}$ atoms/cm$^3$ or less, entirely or partially. The F concentration in the tunnel insulating film 3 can be applied to the examples of FIGS. 13A and 13C to 15A.

In the example of FIG. 13B, the F concentration at the interface S1 may be $5.0 \times 10^{18}$ atoms/cm$^3$ or less, the F concentration at the peak P may be $1.0 \times 10^{20}$ atoms/cm$^3$ or more, and the F concentration at the interface S2 may be $5.0 \times 10^{19}$ atoms/cm$^3$ or less.

Example of FIG. 13C

The F concentration profile shown in FIG. 13C can be implemented by performing the annealing using the $N_2O$ gas in the step shown in FIG. 5B instead of the steps shown in FIGS. 11A and/or FIG. 12A. In the example of FIG. 13C, the F concentration K1 in the charge storage layer 4 before annealing is high, and the F concentration K2 in the charge storage layer 4 after annealing is reduced to have the peak P in the charge storage layer 4. The F concentration K1 is, for example, $1.0 \times 10^{20}$ atoms/cm$^3$ or more. The F concentration K2 increases from the interface S1 to the peak P and decreases from the peak P to the interface S2, along the X direction.

In the example of FIG. 13C, the annealing using the $N_2O$ gas is performed in the step shown in FIG. 5B. Therefore, the F concentration in the charge storage layer 4 decreases mainly near the interface S2 between the charge storage layer 4 and the tunnel insulating film 3. As a result, the F concentration at the interface S2 between the charge storage layer 4 and the tunnel insulating film 3 is $\frac{1}{10}$ or less of the F concentration at the interface S1 between the charge storage layer 4 and the insulating film 5a. In the example of FIG. 13C, the F concentration at the interface S2 is $5.0 \times 10^{18}$ atoms/cm$^3$ or less and the F concentration at the interface S1 and the peak P is $5.0 \times 10^{19}$ atoms/cm$^3$ or more. The signal charge in the charge storage layer 4 is generally stored near the surface of the charge storage layer 4. According to the example of FIG. 13C, since the F concentration of the interface S2 decreases, it is possible to suitably store the signal charge near the interface S2.

In the example of FIG. 13C, the F concentration at the interface S2 may be $5.0 \times 10^{18}$ atoms/cm$^3$ or less, the F concentration at the peak P may be $1.0 \times 10^{20}$ atoms/cm$^3$ or more, and the F concentration at the interface S1 may be $5.0 \times 10^{19}$ atoms/cm$^3$ or less.

Figure 14C:
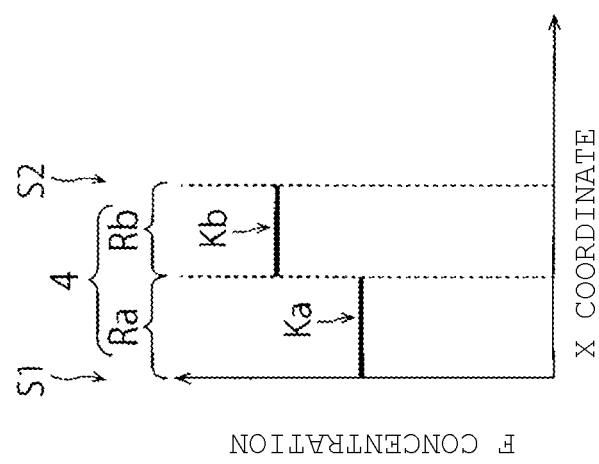
FIGS. 14A to 14C are graphs (2/3) showing examples of the F concentration profile in the semiconductor device of the first embodiment.
Figure 14B:
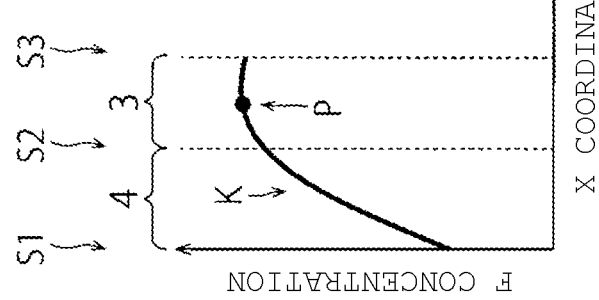
Figure 14A:
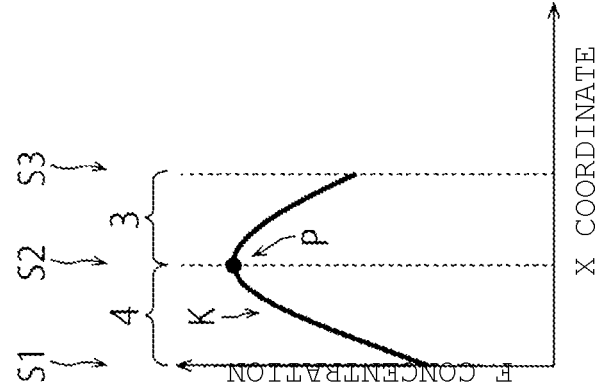

Example of FIG. 14A

FIG. 14A shows the F concentration in the charge storage layer 4 after the annealing shown in FIGS. 11A and 12A. In the example of FIG. 14A, the charge storage layer 4 includes a region Ra having an F concentration Ka and a region Rb having an F concentration Kb. Regions Ra and Rb are examples of first and second regions, respectively. The F concentrations Ka and Kb are examples of first and second fluorine concentrations, respectively.

The region Ra is located on the insulating film 5a side in the charge storage layer 4 and the region Rb is located on the tunnel insulating film 3 side in the charge storage layer 4. In this example, the F concentration Kb is higher than the F concentration Ka. For example, the F concentration Ka is $5.0 \times 10^{18}$ atoms/cm$^3$ or less, and the F concentration Kb is $5.0 \times 10^{19}$ atoms/cm$^3$ or more. This makes it possible to implement an F concentration profile in which the interface S1 has a low concentration and the interface S2 has a high concentration, as in the example of FIG. 13B.

Examples of FIGS. 14B and 14C

Both FIGS. 14B and 14C show the F concentration K in the charge storage layer 4 and the tunnel insulating film 3 after the annealing shown in FIGS. 11A and 12A. In the examples of FIGS. 14B and 14C, the F concentration K in the charge storage layer 4 increases from the interface S1 to the interface S2 along the X direction.

The F concentration K shown in FIG. 14B has a peak P in the tunnel insulating film 3. Meanwhile, the F concentration K shown in FIG. 14C has a peak P at the interface S2 between the charge storage layer 4 and the tunnel insulating film 3. In both FIGS. 14B and 14C, the F concentration K increases from the interface S1 to the peak P and decreases from the peak P to the interface S3, along the X direction.

In the examples of FIGS. 14B and 14C, the F concentration at the interface S1 is $5.0 \times 10^{18}$ atoms/cm$^3$ or less, and the F concentration at the interface S2 and the peak P is $5.0 \times 10^{19}$ atoms/cm$^3$ or more. This makes it possible to implement an F concentration profile in which the interface S1 has a low concentration and the interface S2 has a high concentration, as in the example of FIG. 13B.

Figure 15A:
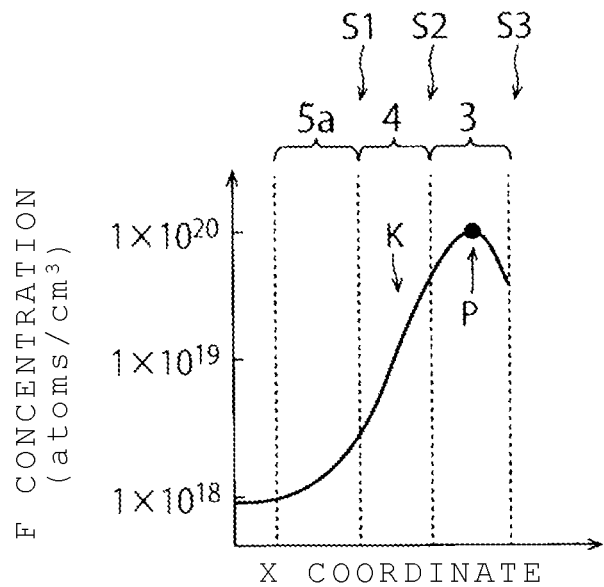
FIGS. 15A to 15D are graphs (3/3) showing examples of the F concentration profile and the like in the semiconductor device of the first embodiment.
Figure 15B:
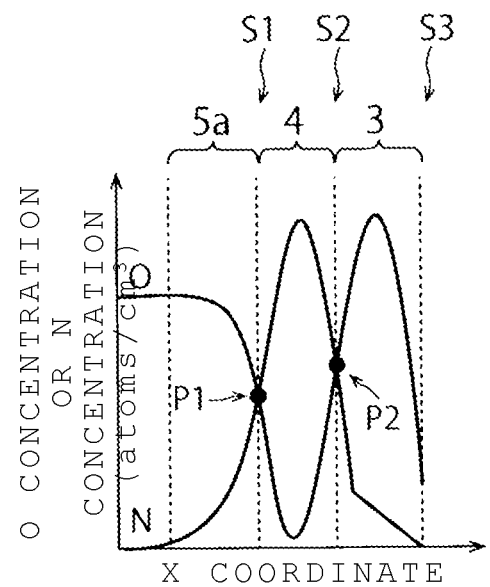

Examples of FIGS. 15A and 15B

FIGS. 15A and 15B show the concentrations of F atom, O (oxygen) atom, and N (nitrogen) atom in the same semiconductor device. Specifically, FIG. 15A shows the F concentration K in the insulating film 5a, the charge storage layer 4, and the tunnel insulating film 3 after the annealing shown in FIGS. 11A and 12A. FIG. 15B shows the O concentration and the N concentration in the insulating film 5a, the charge storage layer 4, and the tunnel insulating film 3 after the annealing shown in FIGS. 11A and 12A.

The F concentration profile shown in FIG. 15A is generally the same as the F concentration profile shown in FIG. 14B. Specifically, the F concentration K in the insulating film 5a and the charge storage layer 4 increases along the X direction. Further, the F concentration K in the tunnel insulating film 3 increases from the interface S2 to the peak P and decreases from the peak P to the interface S3. The F concentration at the interface S1 is $5.0 \times 10^{18}$ atoms/cm$^3$ or less and the F concentration at the interface S2 and the peak P is $5.0 \times 10^{19}$ atoms/cm$^3$ or more. In the example of FIG. 15A, the F concentration at the interface S2 is lower than $1.0 \times 10^{20}$ atoms/cm$^3$ and the F concentration at the peak P is about $1.0 \times 10^{20}$ atoms/cm$^3$.

FIG. 15B shows the O concentration and the N concentration in the insulating film 5a, the charge storage layer 4, and the tunnel insulating film 3. FIG. 15B further shows positions P1 and P2 where the O concentration and the N concentration coincide with each other. The positions of the interfaces S1 and S2 can be specified, for example, by specifying the positions P1 and P2. In the example of FIG. 15B, a region occupied by the charge storage layer 4 is a region where the N concentration is higher than the O concentration. The N concentration and the O concentration can be measured by using, for example, EELS (Electron Energy Loss Spectroscopy) analysis or SIMS (Secondary Ion Mass Spectrometry) analysis.

Figure 15C:
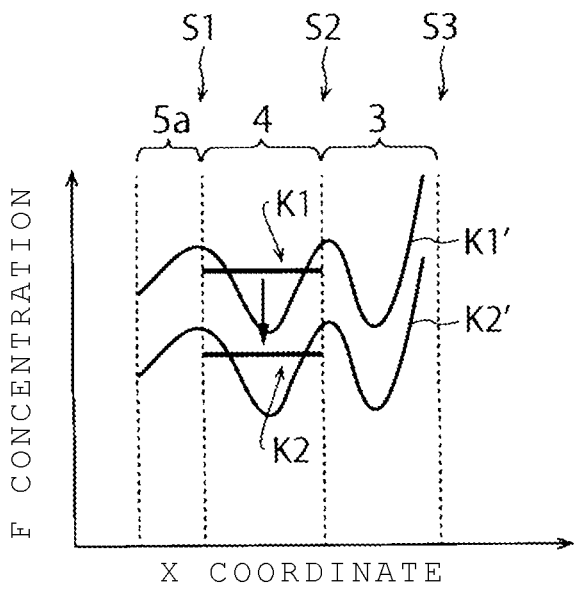
Figure 15D:
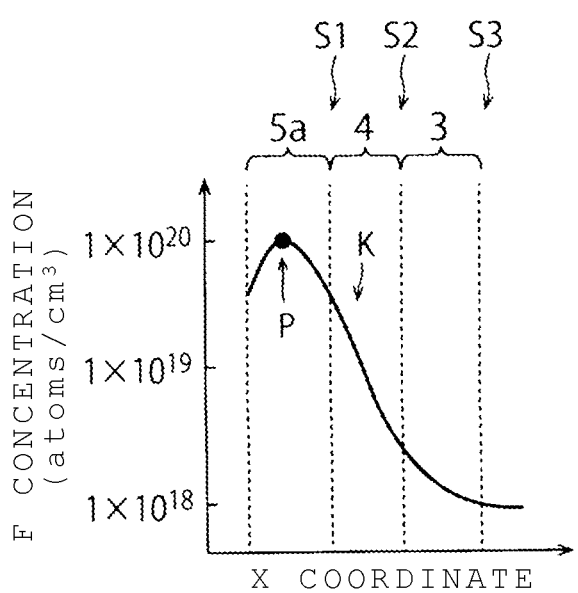

Examples of FIGS. 15C and 15D

FIG. 15C is a graph for illustrating a method for realizing the concentration profile shown in FIG. 13A. FIG. 15C shows a change in the concentration profile when the annealing using the $N_2O$ gas is performed in both the steps shown in FIGS. 11A and/or 12A and the step shown in FIG. 5B. Specifically, an F concentration K1' indicates a concentration before performing the steps shown in FIGS. 11A, 12A, and 5B, and an F concentration K2' indicates a concentration after performing the steps shown in FIGS. 11A, 12A, and 5B. It will be understood that in the charge storage layer 4, the F concentration K1' generally coincides with the F concentration K1 and the F concentration K2' generally coincides with the F concentration K2.

FIG. 15D shows a concentration profile when the annealing using the $N_2O$ gas is performed in the step shown in FIG. 5B without performing the annealing using the $N_2O$ gas in the steps shown in FIGS. 11A and 12A. It will be understood that the concentration profile shown in FIG. 15D has a shape substantially symmetrical to that of the concentration profile shown in FIG. 15A.

Figure 16:
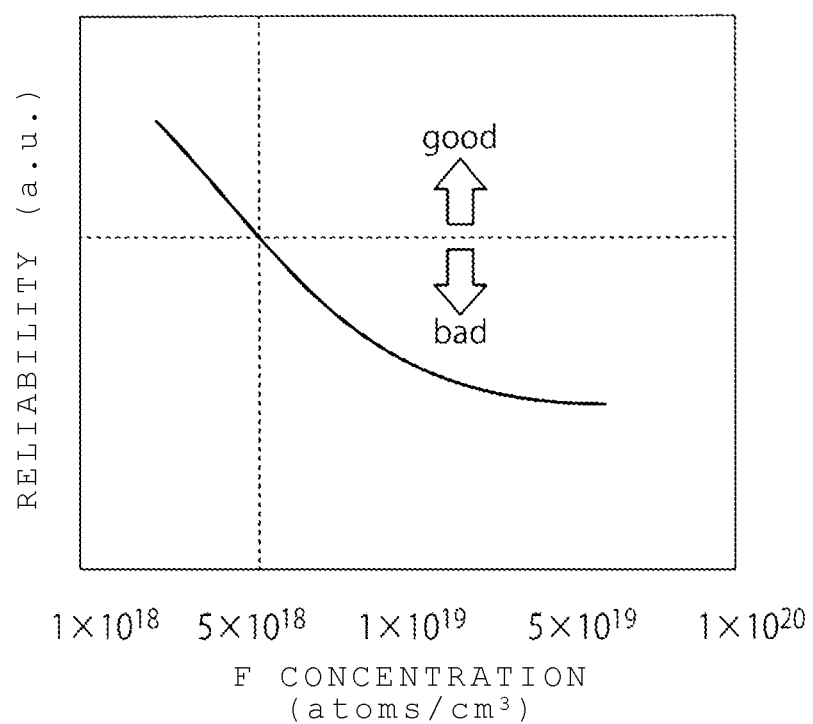
FIG. 16 is a graph related to the F concentration in the semiconductor device of the first embodiment.

FIG. 16 is a graph related to the F concentration in the semiconductor device of the first embodiment.

A horizontal axis of FIG. 16 indicates an F concentration on the surface of the charge storage layer 4, specifically, the F concentration at the interface between the charge storage layer 4 and the insulating film 5a. Meanwhile, a vertical axis of FIG. 16 shows high reliability of the charge storage layer 4.

As a result of the verification, it is found that the reliability of the charge storage layer 4 decreases as the F concentration at the interface between the charge storage layer 4 and the insulating film 5a increases, as shown in FIG. 16. In addition, it is found that the reliability of the charge storage layer 4 becomes good when the F concentration at the interface between the charge storage layer 4 and the insulating film 5a is approximately $5.0 \times 10^{18}$ atoms/cm³ or less. Therefore, it is desirable that the F concentration in the charge storage layer 4 of at least one embodiment is $5.0 \times 10^{18}$ atoms/cm³ or less on the surface of the charge storage layer 4.

As described above, the charge storage layer 4 of at least one embodiment includes a location having the F concentration of $5.0 \times 10^{18}$ atoms/cm³ or less. Further, the F concentration at the interface S2 between the charge storage layer 4 and the tunnel insulating film 3 of the present embodiment is, for example, 10 times or more or 1/10 or less of the F concentration at the interface S1 between the charge storage layer 4 and the insulating film 5a. Therefore, according to at least one embodiment, it is possible to prevent the charge from escaping from the charge storage layer 4 by reducing the F concentration on the surface of the charge storage layer 4.

Second Embodiment

Figure 17:
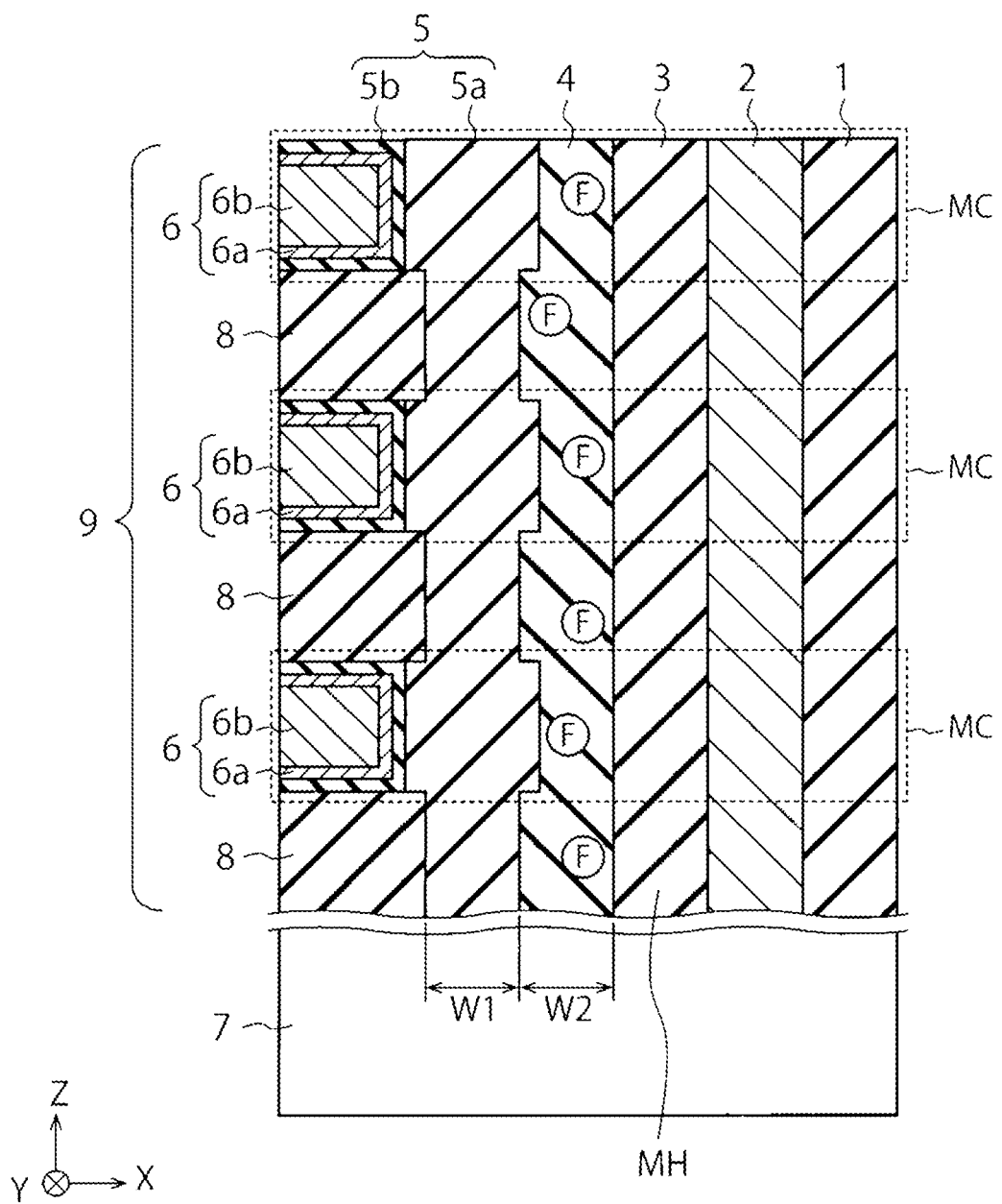
FIG. 17 is a cross-sectional view showing a structure of a semiconductor device of a second embodiment.

FIG. 17 is a cross-sectional view showing a structure of a semiconductor device of a second embodiment.

The semiconductor device of the second embodiment (FIG. 17) has the same components as the semiconductor device of the first embodiment (FIG. 3). However, a film thickness W1 of the insulating film 5a of the present embodiment varies along the Z direction. Similarly, a film thickness W2 of the charge storage layer 4 of the present embodiment varies along the Z direction.

Specifically, the film thickness W1 of the insulating film 5a is thick in the memory cell MC and thin outside the memory cell MC. On the other hand, the film thickness W2 of the charge storage layer 4 is thin in the memory cell MC and thick outside the memory cell MC. As a result, as shown in FIG. 17, the film thickness W2 of the charge storage layer 4 of the present embodiment is thicker outside the memory cell MC than in the memory cell MC. A film thickness of the charge storage layer 4 outside the memory cell MC of the present embodiment is thicker by 1 nm or more than the film thickness of the charge storage layer 4 in the memory cell MC. The charge storage layer 4 outside the memory cell MC is an example of a first portion and the charge storage layer 4 in the memory cell MC is an example of a second portion.

The semiconductor device of the present embodiment is manufactured by the method shown in FIGS. 3 to 12B, similarly to the semiconductor device of the first embodiment. In this case, when the $N_2O$ gas is supplied from each cavity C2 to the charge storage layer 4 by the annealing shown in FIGS. 11A and 12A, the insulating film 5a and the charge storage layer 4 on a side of each cavity C2, that is, at the same height as each cavity C2, are oxidized or expanded. As a result, the film thickness W1 of the insulating film 5a becomes thicker on the side of each cavity C2, and the film thickness W2 of the charge storage layer 4 becomes thinner on the side of each cavity C2. As a result, the structure shown in FIG. 17 is implemented.

According to the present embodiment, the charge storage layer 4 has the film thickness W2 that varies along the Z direction. For example, a maximum film thickness of the charge storage layer 4 provided on an outer periphery of one channel semiconductor layer 2 is thicker by 1 nm or more than a minimum film thickness of the charge storage layer 4.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
   a plurality of electrode layers separated from each other in a first direction;
   a charge storage layer disposed on side surfaces of the plurality of electrode layers via a first insulating film; and
   a semiconductor layer disposed on a side surface of the charge storage layer via a second insulating film, wherein
   the charge storage layer includes a portion having a fluorine concentration of $5.0 \times 10^{18}$ atoms/cm³ or less, and
   a fluorine concentration at an interface between the charge storage layer and the second insulating film is 10 times or more, or 1/10 or less, that of a fluorine concentration at an interface between the charge storage layer and the first insulating film.

2. The semiconductor device according to claim 1, wherein
the fluorine concentration at the interface between the charge storage layer and the first insulating film is $5.0 \times 10^{18}$ atoms/cm$^3$ or less, and
the fluorine concentration at the interface between the charge storage layer and the second insulating film is $5.0 \times 10^{19}$ atoms/cm$^3$ or more.

3. The semiconductor device according to claim 1, wherein
the second insulating film includes a location having a fluorine concentration of $1.0 \times 10^{19}$ atoms/cm$^3$ or more and $1.0 \times 10^{20}$ atoms/cm$^3$ or less.

4. The semiconductor device according to claim 1, wherein
the fluorine concentration at the interface between the charge storage layer and the first insulating film is $5.0 \times 10^{19}$ atoms/cm$^3$ or more, and
the fluorine concentration at the interface between the charge storage layer and the second insulating film is $5.0 \times 10^{18}$ atoms/cm$^3$ or less.

5. The semiconductor device according to claim 1, wherein
the fluorine concentration in the charge storage layer (i) increases from the first insulating film to a predetermined location, and (ii) decreases from the predetermined location to the second insulating film, along a second direction from the first insulating film to the second insulating film.

6. The semiconductor device according to claim 1, wherein the charge storage layer includes:
a first region having a first fluorine concentration, and
a second region provided on the second insulating film side with respect to the first region, the second region having a second fluorine concentration higher than the first fluorine concentration.

7. The semiconductor device according to claim 6, wherein
the first fluorine concentration is $5.0 \times 10^{18}$ atoms/cm$^3$ or less, and
the second fluorine concentration is $5.0 \times 10^{19}$ atoms/cm$^3$ or more.

8. The semiconductor device according to claim 1, wherein
the fluorine concentration in the charge storage layer increases from the first insulating film to the second insulating film along a second direction from the first insulating film to the second insulating film.

9. The semiconductor device according to claim 1, wherein
the fluorine concentration in the charge storage layer and the second insulating film has a peak in the second insulating film.

10. The semiconductor device according to claim 1, wherein
the fluorine concentration in the charge storage layer and the second insulating film has a peak at the interface between the charge storage layer and the second insulating film.

11. The semiconductor device according to claim 1, wherein
a film thickness of a first portion of the charge storage layer is thicker than 1 nm or more of a film thickness of a second portion of the charge storage layer.

12. The semiconductor device according to claim 11, further comprising:
a plurality of memory cells, wherein
the first portion of the charge storage layer is disposed outside the memory cell, and
the second portion of the charge storage layer is disposed in the memory cell.

13. A semiconductor device comprising:
a plurality of electrode layers separated from each other in a first direction;
a charge storage layer disposed on side surfaces of the plurality of electrode layers via a first insulating film; and
a semiconductor layer disposed on a side surface of the charge storage layer via a second insulating film, wherein
the charge storage layer includes a portion having a fluorine concentration of $5.0 \times 10^{18}$ atoms/cm$^3$ or less, and
a maximum value of a fluorine concentration in the charge storage layer is 10 times or more a minimum value of a fluorine concentration in the charge storage layer.

14. The semiconductor device according to claim 13, wherein
a fluorine concentration at an interface between the charge storage layer and the second insulating film is 10 times or more or 1/10 or less of a fluorine concentration at an interface between the charge storage layer and the first insulating film.

15. A method for manufacturing a semiconductor device comprising:
forming a plurality of first layers separated from each other in a first direction;
forming a charge storage layer on side surfaces of the plurality of first layers via a first insulating film;
forming a semiconductor layer on a side surface of the charge storage layer via a second insulating film;
removing the plurality of first layers to form a plurality of first recess portions; and
forming a plurality of electrode layers in the plurality of first recess portions, wherein
a fluorine concentration in a portion of the charge storage layer has a fluorine concentration of $5.0 \times 10^{18}$ atoms/cm$^3$ or less, and
a fluorine concentration at an interface between the charge storage layer and the second insulating film is set to be 10 times or more, or 1/10 or less, of a fluorine concentration at an interface between the charge storage layer and the first insulating film.

16. The method for manufacturing the semiconductor device according to claim 15, further comprising:
performing annealing in an atmosphere containing nitrogen and oxygen between formation of the first recess portion and formation of the electrode layer.

17. The method for manufacturing the semiconductor device according to claim 16, wherein
the annealing reduces the fluorine concentration in the charge storage layer, and the fluorine concentration in the portion of the charge storage layer is $5.0 \times 10^{18}$ atoms/cm$^3$ or less.

18. The method for manufacturing the semiconductor device according to claim 16, further comprising:
forming a third insulating film in the first recess portion between the formation of the first recess portion and the formation of the electrode layer, wherein
the annealing is performed before forming the third insulating film.

19. The method for manufacturing the semiconductor device according to claim 16, further comprising:
forming a third insulating film in the first recess portion between the formation of the first recess portion and the formation of the electrode layer, wherein
the annealing is performed after forming the third insulating film.

20. The method for manufacturing the semiconductor device according to claim 15, wherein
a film thickness of a first portion of the charge storage layer is at least 1 nm thicker than a film thickness of a second portion of the charge storage layer.

* * * * *